US012575111B2

(12) United States Patent
Lin et al.

(10) Patent No.: US 12,575,111 B2
(45) Date of Patent: Mar. 10, 2026

(54) BACK-END-OF-LINE 2D MEMORY CELL

(71) Applicant: Intel Corporation, Santa Clara, CA (US)

(72) Inventors: Chia-Ching Lin, Portland, OR (US); Shriram Shivaraman, Hillsboro, OR (US); Kevin P. O'Brien, Portland, OR (US); Ashish Verma Penumatcha, Beaverton, OR (US); Chelsey Dorow, Portland, OR (US); Kirby Maxey, Hillsboro, OR (US); Carl H. Naylor, Portland, OR (US); Sudarat Lee, Hillsboro, OR (US); Uygar E. Avci, Portland, OR (US); Sou-Chi Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 740 days.

(21) Appl. No.: 17/855,626

(22) Filed: Jun. 30, 2022

(65) Prior Publication Data

US 2024/0008290 A1      Jan. 4, 2024

(51) Int. Cl.
| | |
|---|---|
| *H10D 64/00* | (2025.01) |
| *H01L 23/48* | (2006.01) |
| *H10B 53/30* | (2023.01) |
| *H10D 30/01* | (2025.01) |
| *H10D 30/69* | (2025.01) |
| *H10D 64/68* | (2025.01) |

(52) U.S. Cl.
CPC ........... *H10B 53/30* (2023.02); *H01L 23/481* (2013.01); *H10D 30/0415* (2025.01); *H10D 30/701* (2025.01); *H10D 64/689* (2025.01)

(58) Field of Classification Search
CPC ........ H10B 53/30; H10B 12/05; H10B 51/30; H01L 23/481; H10D 30/0415; H10D 30/701; H10D 64/689; H10D 30/6755; H10D 30/6757; H10D 30/675; H10D 64/033
USPC ......................................................... 257/295
See application file for complete search history.

(56) References Cited

U.S. PATENT DOCUMENTS

| | | | | | |
|---|---|---|---|---|---|
| 9,640,531 | B1 * | 5/2017 | Or-Bach | .............. | H10D 88/101 |
| 2011/0147917 | A1 * | 6/2011 | England | ........... | H01L 23/49838 |
| | | | | | 257/E23.141 |
| 2016/0329272 | A1 * | 11/2016 | Geissler | ........... | H01L 23/49827 |
| 2017/0352618 | A1 * | 12/2017 | Fitzsimmons | .... | H01L 23/49822 |
| 2018/0025970 | A1 * | 1/2018 | Kao | .................. | H01L 21/76898 |
| | | | | | 257/401 |
| 2018/0076137 | A1 * | 3/2018 | Goktepeli | ................ | H04B 1/16 |
| 2019/0103339 | A1 * | 4/2019 | Goktepeli | ............. | H01L 23/481 |
| 2019/0273116 | A1 * | 9/2019 | Goktepeli | ................ | H03H 9/64 |
| 2020/0411528 | A1 * | 12/2020 | Sung | ...................... | H10B 12/05 |
| 2021/0091127 | A1 * | 3/2021 | Tsao | .................... | H10F 39/8053 |
| 2021/0183722 | A1 * | 6/2021 | Anderson | .............. | H01L 24/20 |

(Continued)

*Primary Examiner* — Sheikh Maruf
(74) *Attorney, Agent, or Firm* — Schwabe, Williamson & Wyatt, P.C.

(57) ABSTRACT

Embodiments described herein may be related to apparatuses, processes, systems, and/or techniques directed to creating back end of line 2D transistors that include a metal-ferroelectric-metal-insulator-semiconductor structure used as a memory cell. In embodiments, a combination wet etch and dry etch process may be used to form the 2D transistors. Other embodiments may be described and/or claimed.

22 Claims, 20 Drawing Sheets

(56)        References Cited

U.S. PATENT DOCUMENTS

2021/0272886 A1*    9/2021    Bonifield  .......... H01L 23/49811
2023/0240079 A1*    7/2023    Cheng  .................... H10B 53/30

* cited by examiner

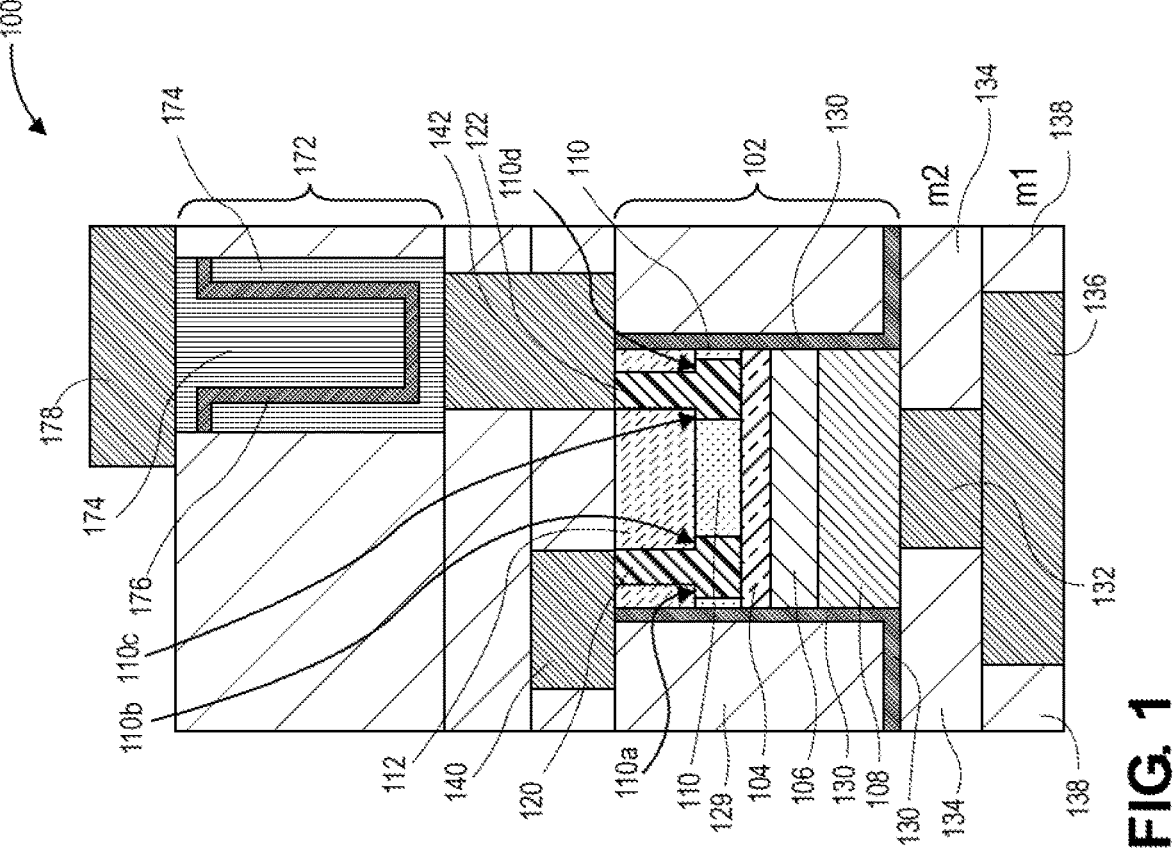
FIG. 1
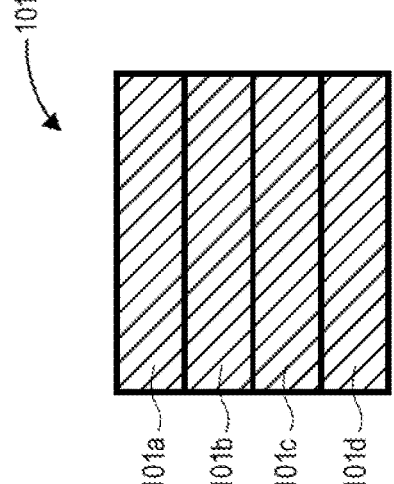

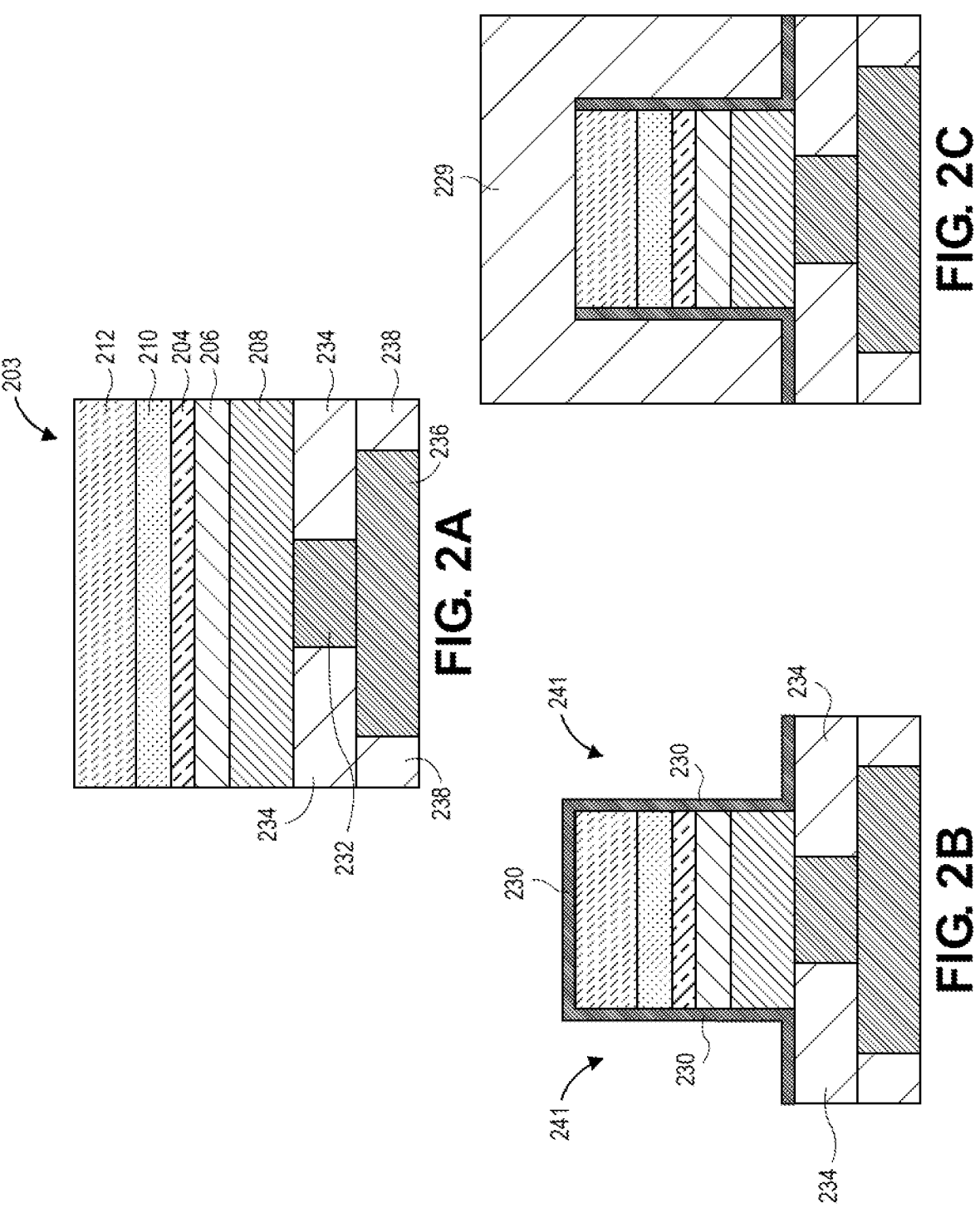

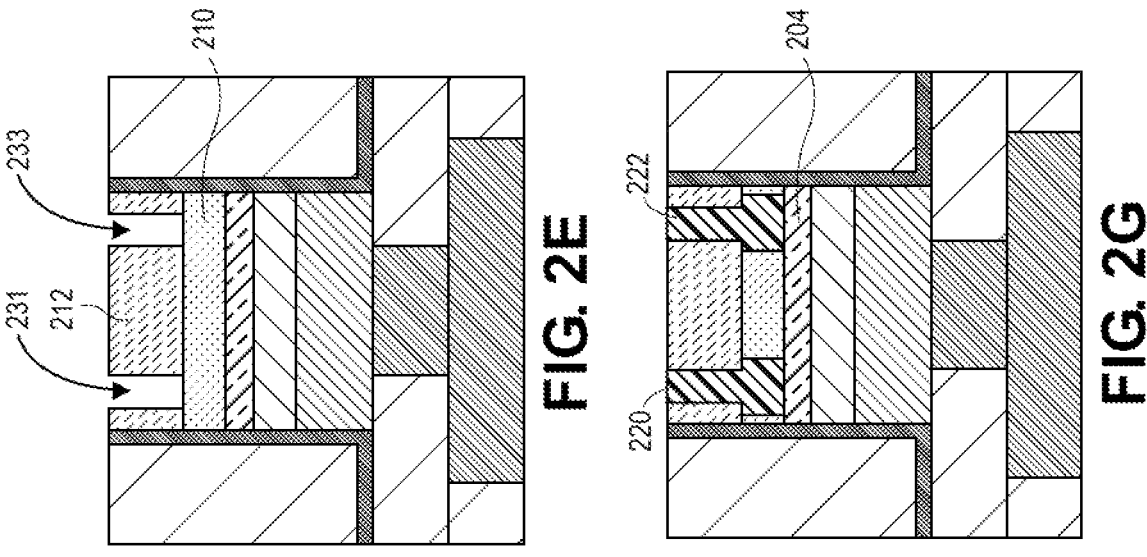
FIG. 2D
FIG. 2E
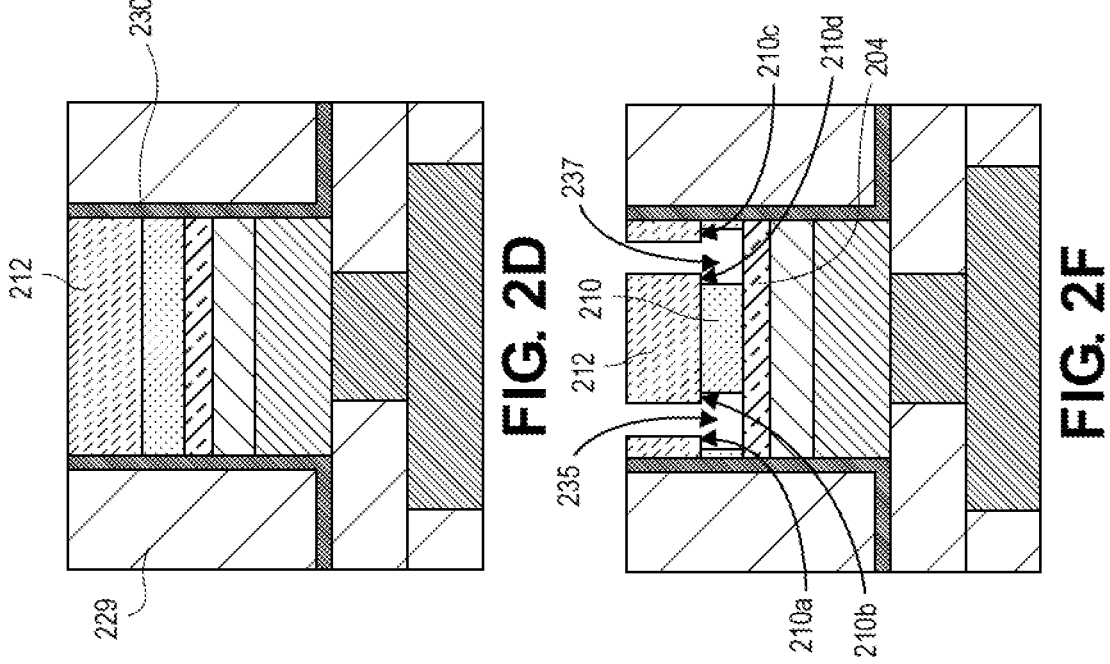
FIG. 2F
FIG. 2G

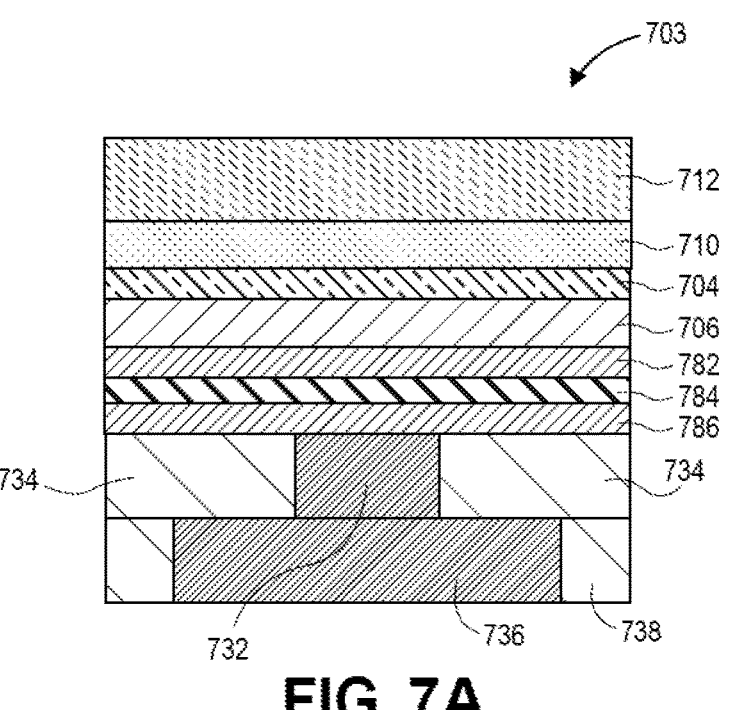
FIG. 7A
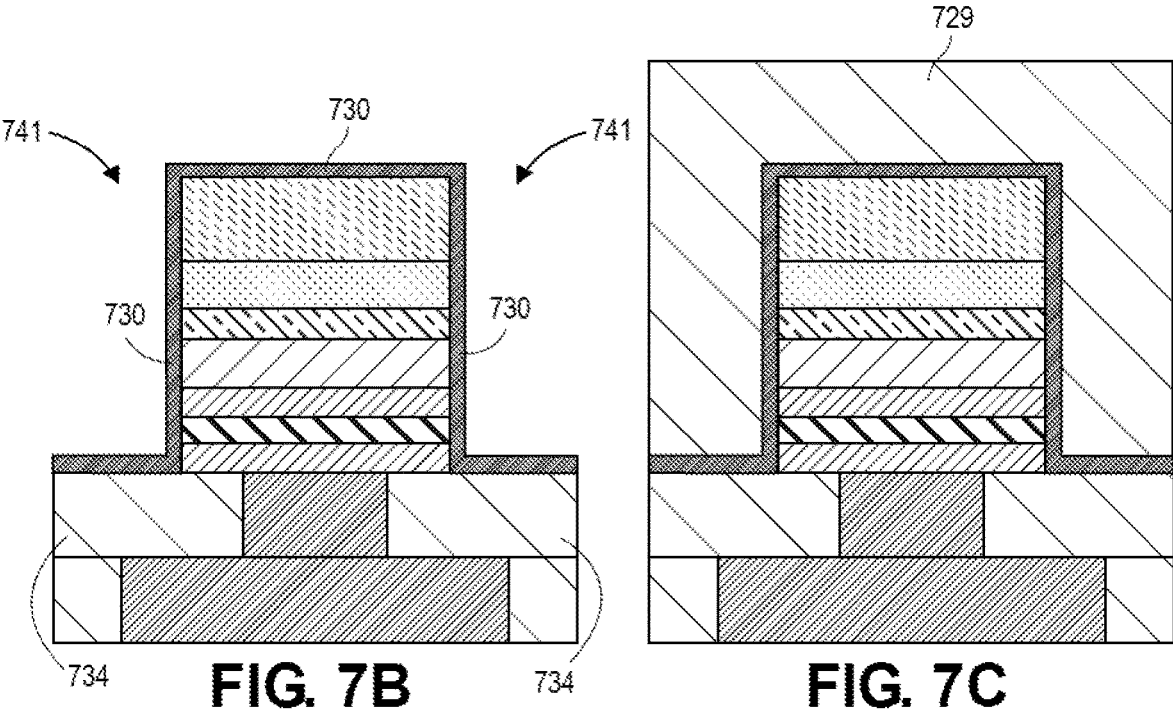
FIG. 7B                       FIG. 7C

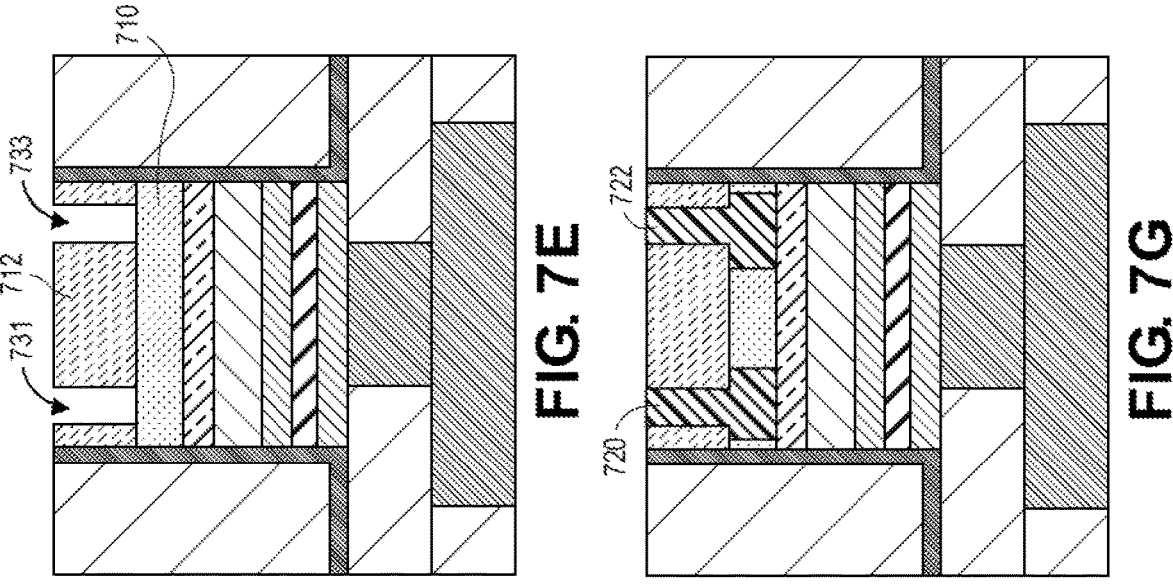
FIG. 7E
FIG. 7G
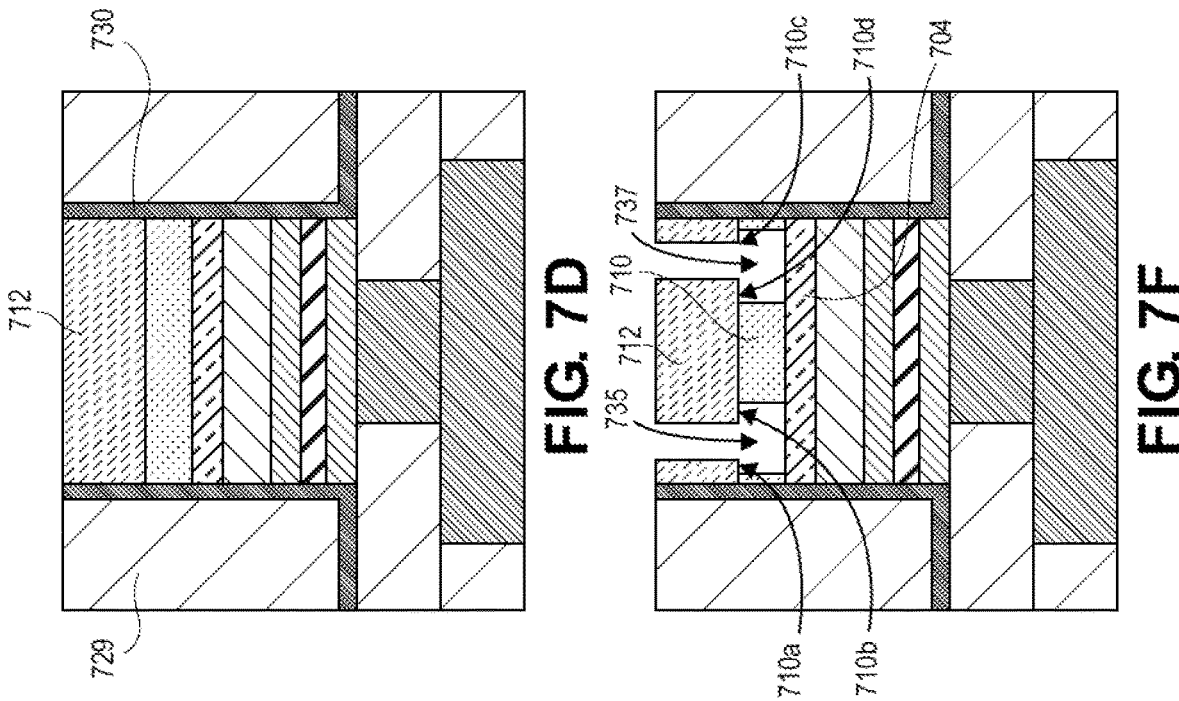
FIG. 7D
FIG. 7F

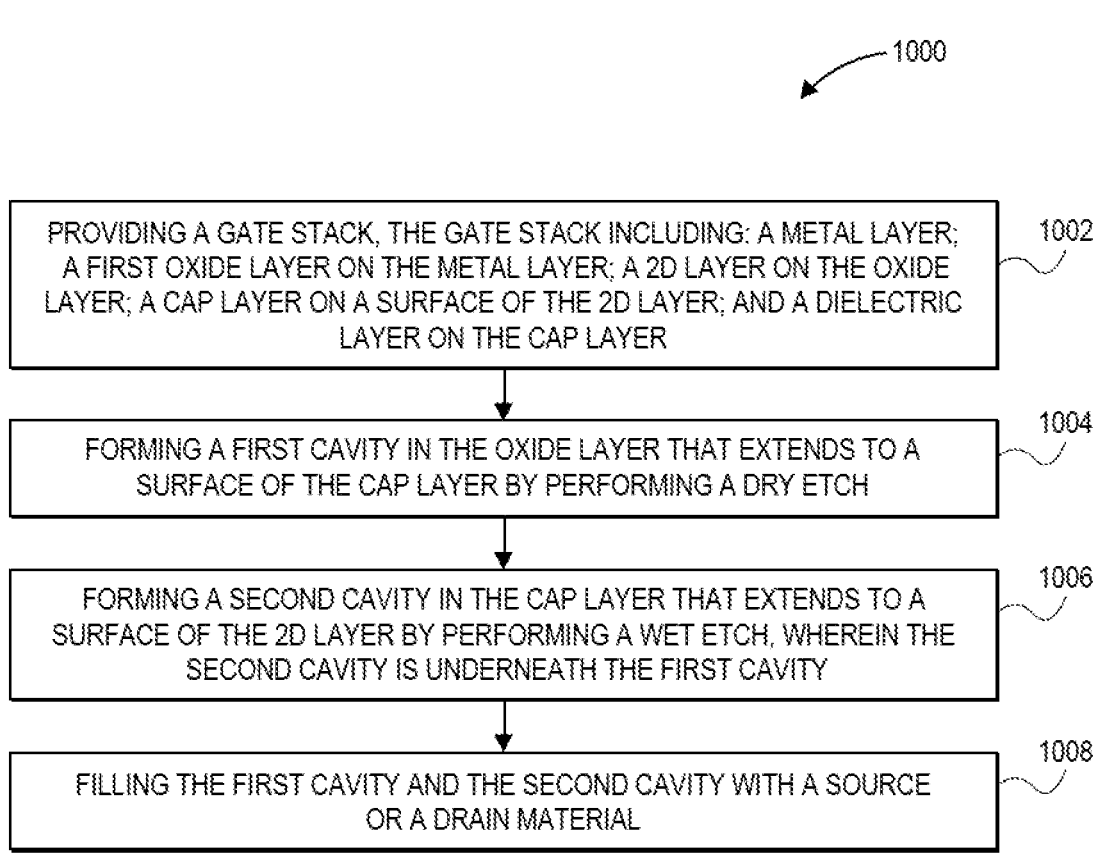

— 1000

PROVIDING A GATE STACK, THE GATE STACK INCLUDING: A METAL LAYER; A FIRST OXIDE LAYER ON THE METAL LAYER; A 2D LAYER ON THE OXIDE LAYER; A CAP LAYER ON A SURFACE OF THE 2D LAYER; AND A DIELECTRIC LAYER ON THE CAP LAYER — 1002

FORMING A FIRST CAVITY IN THE OXIDE LAYER THAT EXTENDS TO A SURFACE OF THE CAP LAYER BY PERFORMING A DRY ETCH — 1004

FORMING A SECOND CAVITY IN THE CAP LAYER THAT EXTENDS TO A SURFACE OF THE 2D LAYER BY PERFORMING A WET ETCH, WHEREIN THE SECOND CAVITY IS UNDERNEATH THE FIRST CAVITY — 1006

FILLING THE FIRST CAVITY AND THE SECOND CAVITY WITH A SOURCE OR A DRAIN MATERIAL — 1008

FIG. 10

BACK-END-OF-LINE 2D MEMORY CELL

FIELD

Embodiments of the present disclosure generally relate to the field of semiconductor packaging, and in particular to transistor structures used for memory.

BACKGROUND

Continued growth in virtual machines, cloud computing, and portable devices will continue to increase the demand for high density transistors within chips and packages to create higher density memory storage.

BRIEF DESCRIPTION OF THE DRAWINGS

FIG. 1 shows a cross section side view of a back-end-of-line (BEOL) transistor coupled with a capacitor to form a memory cell, and a schematic of memory layers, in accordance with various embodiments.

FIGS. 2A-2I illustrate cross section side views of stages in a manufacturing process for creating a BEOL transistor coupled with a capacitor to form a memory cell, in accordance with various embodiments.

FIGS. 7A-7I illustrate cross section side views of stages in a manufacturing process for creating a BEOL transistor that functions as a memory cell, in accordance with various embodiments.

FIG. 10 illustrates an example process for manufacturing a BEOL transistor that functions as a memory cell, in accordance with various embodiments.

DETAILED DESCRIPTION

Figure 2I:
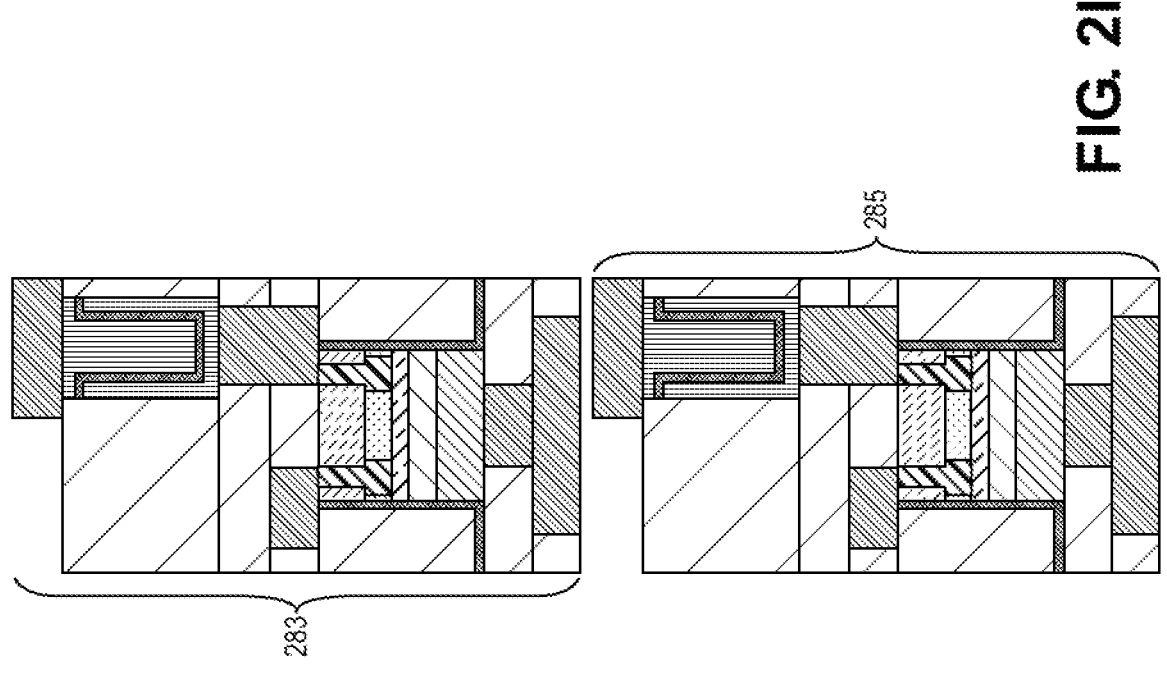

Embodiments described herein may be related to apparatuses, processes, systems, and/or techniques directed to creating a BEOL 2D transistor that may be used as an access transistor for a memory cell, which may be referred to as a memory device. In embodiments, the 2D transistor may be implemented as a field-effect transistor (FET) that may be coupled with a capacitor, which may be referred to as a 1T-1C, to act as a memory cell.

In embodiments, the 2D transistor may include memory storage within the transistor structure, for example by using a metal-ferroelectric-metal-insulator-semiconductor (MF-MIS) structure. In embodiments that involve back-gated structures, the top metal and insulator may protect hafnium-zirconium oxide (HZO) during 2D layer growth, and a choice of insulator may promote good quality 2D layer growth. In embodiments that involve dual-gated structures, high-quality insulators may be grown on the 2D layer.

In embodiments, layers of these 2D transistor-based memory cells may be stacked on each other to form layers of memory. In embodiments, the 2D FET may be used for peripheral memory circuits such as, but not limited to, row decoders, column multiplexers, sense amplifiers, and for bit line pre-charge logic.

In embodiments described herein, during manufacture of a transistor structure, a 2D layer may have a cap layer on top of the 2D layer and a dielectric layer on top of the cap layer. A combination of a dry etch process may be used to create a cavity in the dielectric layer to a surface of the cap layer, and then a wet etch process may be used to extend the cavity through the cap layer to reach a surface of the 2D layer. A source or a drain may then be formed within the created cavities that electrically couple with the 2D layer. In legacy implementations that use only dry etch, it is not possible to stop on the 2D layer because the 2D layer may be only 1 nm thick. However, by doing a dry etch and then a wet etch, the etch may be precisely stopped on the 2D layer.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows a cross section side view of a BEOL transistor coupled with a capacitor to form a memory cell, and a schematic of memory layers, in accordance with various embodiments. BEOL device 100 includes a transistor 102 within layers of the BEOL, and a capacitor 172 that is electrically and physically coupled with the transistor 102.

The transistor 102 may include a 2D layer 104, which may also be referred to as a nano-ribbon. The 2D layer 104 may be a transition metal dichalcogenide (TMD) monolayer, which may be an atomically thin semiconductor that includes a transition-metal atom such as molybdenum or tungsten, and a chalcogen atom such as sulfur, selenium, or tellurium. In embodiments, the 2D layer 104 may be grown on an oxide layer 106, which may include silicon dioxide. In embodiments, the oxide layer 106 may be on a metal layer 108, which may include copper, aluminum, cobalt, titanium nitride, or tungsten.

Above the 2D layer 104 there may be a cap layer 110, and a dielectric layer 112 above the cap layer 110. In embodiments, the cap layer 110 may include aluminum (Al), lanthanum (La), hafnium (Hf), titanium (Ti), Oxygen (O), $Al_2O_3$, $La_2O_3$, $HfO_2$, and/or $TiO_2$. In embodiments, the dielectric layer 112 may include silicon nitride.

In embodiments, a source 120 and a drain 122 may extend through the dielectric layer 112 and the cap layer 110 and come into physical contact with the 2D layer 104. In embodiments, the source 120 and/or the drain 122 may extend into the 2D layer 104. In embodiments, as described below, a wet etch process may be used to etch a cavity within the cap layer 110 into which the source 120 or the drain 122 may be inserted. In embodiments, the wet etch process may result in etched portions of the cap layer 110a, 110b, 110c, 110d to be created underneath a side of the dielectric layer 112. As a result, when the source 120 and the drain 122 are inserted, portions of the source 120 and the drain 122 may fill into the etched portions of the cap layer 110a, 110b, 110c, 110d as shown.

In embodiments, a dielectric layer 130, which may be a high-k dielectric layer or an oxide layer, may at least partially surround the metal layer 108, the oxide layer 106, the 2D layer 104, the cap layer 110, and the dielectric layer 112. In embodiments, the dielectric layer 130 may include $Al_2O_3$, $La_2O_3$, $HfO_2$, and/or $TiO_2$. In embodiments, the dielectric layer 130 may be an oxide that is deposited using atomic layer deposition (ALD) techniques. In embodiments, the dielectric layer 130 may include aluminum oxide, hafnium oxide, zirconium oxide, titanium oxide, silicon oxide, or silicon nitride (SiNx). In embodiments, a dielectric 129, which may include silicon oxide, may surround at least a portion of the dielectric layer 130.

In embodiments, the metal layer 108 may be electrically coupled with an electrically conductive via 132 within a metal 2 (m2) layer of the BEOL device 100. In embodiments, the conductive via 132 may be surrounded by a dielectric layer 134. In embodiments a metal contact 136 may be at a metal 1 (m1) layer of the BEOL device 100, and electrically couple with the conductive via 132. In embodiments, the metal contact 136 may be surrounded by dielectric 138.

In embodiments, the source 120 may be electrically coupled with a conductive via 140, and the drain 122 may be coupled with one or more metal vias 142 that electrically couple with the capacitor 172. In embodiments, the capacitor 172 may include a metal 174 that is separated by a dielectric material 176. In embodiments, the dielectric material 176 may be a high-k dielectric material that may be similar to dielectric layer 130. In embodiments, the metal 174 may be electrically coupled with an electrical contact 178.

Diagram 101 shows an example of stacked memory layers 101a-101d. In embodiments, each layer may include one or more devices similar to the BEOL device 100 to form a memory. In embodiments, the stacking may not be limited to four layers. In other embodiments, the stacked memory layers 101a-101d be themselves be in stacks of layers (not shown).

FIGS. 2A-2I illustrate cross section side views of stages in a manufacturing process for creating a BEOL transistor coupled with a capacitor to form a memory cell, in accordance with various embodiments. FIG. 2A shows a cross section side view of a stage in the manufacturing process where a partial gate stack 203 is provided. In embodiments, the partial gate stack 203 may be referred to as a local bottom gate. Partial gate stack 203 includes a metal contact 236 that may be surrounded by dielectric 238, and a conductive via 232 which may be on the metal contact 236 and surrounded by dielectric 234. In embodiments, metal contact 236, dielectric 238 conductive via 232 and dielectric 234 may be similar to metal contact 136, dielectric 138, connected via 132, and dielectric 134 of FIG. 1.

A metal layer 208 may be on the conductive via 232. An oxide layer 206 may be on the metal layer 208, and a 2D layer 204 may be on the oxide layer 206. A cap layer 210 may be on the 2D layer 204, and a dielectric layer 212 may be on the cap layer 210. In embodiments, the metal layer 208, the oxide layer 206, the 2D layer 204, the cap layer 210 and the dielectric layer 212 may be similar to metal layer

108, oxide layer 106, 2D layer 104, cap layer 110, and dielectric layer 112 of FIG. 1.

FIG. 2B shows a cross section side view of a stage in the manufacturing process where cavities 241 are formed in the partial gate stack 203 of FIG. 2A down to the dielectric 234. In embodiments, the cavities 241 may be formed using an etch process. Subsequently, a dielectric layer 230, which may also be referred to as an oxide layer, may be applied to the structure. In embodiments, the dielectric layer 230 may be similar to dielectric layer 130 of FIG. 1. In embodiments, a thickness of the dielectric layer 230 may range from 1 nm to 10 nm.

FIG. 2C shows a cross section side view of a stage in the manufacturing process where a dielectric 229, which may be similar to dielectric 129 of FIG. 1, may be applied on the dielectric layer 230.

FIG. 2D shows a cross section side view of a stage in the manufacturing process where the dielectric 229 is polished down to the surface of the dielectric layer 212. In embodiments, the polishing removes a top portion of the dielectric layer 230.

FIG. 2E shows a cross section side view of a stage in the manufacturing process where cavities 231, 233 are formed within the dielectric layer 212. In embodiments, a dry etch process is used to form the cavities 231, 233. In embodiments, the dry etch process stops at the cap layer 210.

FIG. 2F shows a cross section side view of a stage in the manufacturing process where cavities 235, 237 are formed within the cap layer 210, down to a surface of the 2D layer 204. In embodiments, a wet etch process is used to create cavities 235, 237. In embodiments, a wet etch process will not damage the 2D layer 204. Using a dry etch process to form cavities 235, 237 would damage the 2D layer 204, in particular because the 2D layer 204 is only 1 nanometer thick.

In embodiments, the wet etch will also etch the cap layer 210 into etched portions of the cap layer 210a, 210b, 210c, 210d underneath a surface of the dielectric layer 212. As a result, the cavities 235, 237 may be wider than the cavities 231, 233 of FIG. 2E that were created using a dry etch process.

FIG. 2G shows a cross section side view of a stage in the manufacturing process where a source 220 and a drain 222, which may be similar to source 120 and drain 122 of FIG. 1, are formed by inserting material into the cavities 231, 233 of FIG. 2E, and into the cavities 235, 237 of FIG. 2F. In embodiments, the source 220 and the drain 222 will come into contact with the 2D layer 204. In embodiments, the source 220 and the drain 222 may extend into the 2D layer 204.

Figure 2H:
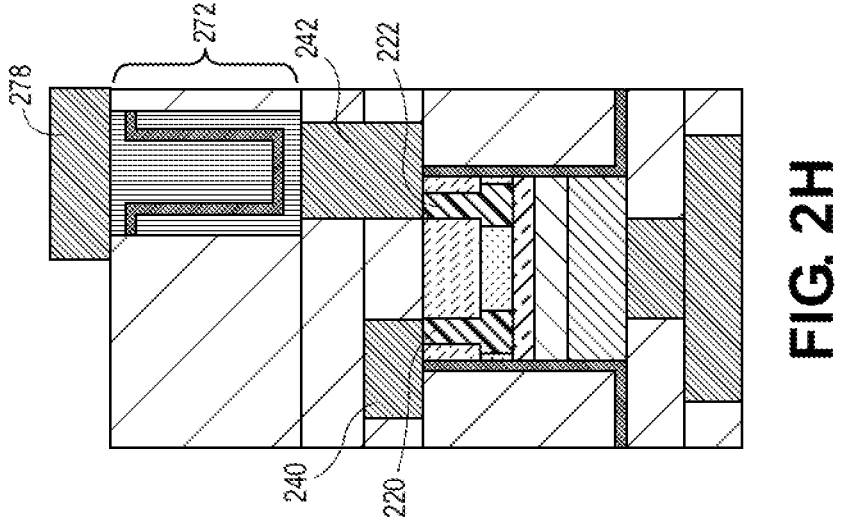

FIG. 2H shows a cross section side view of a stage in the manufacturing process where an electrically conductive via 240, which may be similar to electrically conductive via 140 of FIG. 1, is placed on the source 220, and one or more electrically conductive vias 242 are placed on the drain 222. In embodiments, a capacitor 272, which may be similar to capacitor 172 of FIG. 1, may be placed on the one or more electrically conductive vias 242 to electrically couple the capacitor 272 with the drain 222. In embodiments, an electrical contact 278, which may be similar to electrical contact 178 of FIG. 1, may be placed on the capacitor 272. Note that in embodiments, FIG. 2H may be similar to BEOL device 100 of FIG. 1.

FIG. 2I shows a cross section side view of a stage in the manufacturing process where two BEOL devices 283, 285, each which may be similar to BEOL device 100 of FIG. 1, may be stacked on each other to create a layer memory.

Figure 3:
FIG. 3 shows a cross section side view of another BEOL transistor coupled with a capacitor to form a memory cell, in accordance with various embodiments.

FIG. 3 shows a cross section side view of another BEOL transistor coupled with a capacitor to form a memory cell, in accordance with various embodiments. BEOL device 300, which may be similar to BEOL device 100 of FIG. 1, includes a transistor 302 within layers of the BEOL, and a capacitor 372 that is electrically and physically coupled with the transistor 302.

The transistor 302 may include a 2D layer 304, which may also be referred to as a nano-ribbon. The 2D layer 304 may be a TMD monolayer, which may be an atomically thin semiconductor that includes a transition-metal atom such as molybdenum or tungsten, and a chalcogen atom such as sulfur, selenium, or tellurium. In embodiments, the 2D layer 304 may be grown on an oxide layer 306, which may include silicon dioxide. In embodiments, the oxide layer 306 may be on a metal layer 308, which may include copper, aluminum, cobalt, titanium nitride, or tungsten.

Above the 2D layer 304 there may be a cap layer 310, and a dielectric layer 312 above the cap layer 310. In embodiments, the cap layer 310 may include Al, La, Hf, Ti, $0$, $Al_2O_3$, $La_2O_3$, $HfO_2$, and/or $TiO_2$. In embodiments, the dielectric layer 312 may include silicon nitride. In embodiments, the 2D layer 304, the oxide layer 306, the metal layer 308, the cap layer 310, and the dielectric layer 312 may be similar to 2D layer 104, the oxide layer 106, the metal layer 108, the cap layer 110, and the dielectric layer 112 of FIG. 1.

In embodiments, a source 320 and a drain 322, which may be similar to source 120 and drain 122 of FIG. 1, may extend through the dielectric layer 312 and the cap layer 310 to come into physical contact with the 2D layer 304. In embodiments, the source 320 and/or the drain 322 may extend into the 2D layer 304. In embodiments, as described below, a wet etch process may be used to etch a cavity within the cap layer 310 into which the source 120 or the drain 122 may be inserted. In embodiments, the wet etch process may result in etched portions of the cap layer 310a, 310b to be created underneath a side of the dielectric layer 312. As a result, when the source 220 and the drain 222 are inserted, portions of the source 220 and the drain 222 may fill in underneath the side of the dielectric layer 312 in the etched portions of the cap layer 310a, 310b.

In embodiments, a dielectric layer 330, which may be similar to dielectric layer 130 of FIG. 1, may at least partially surround the metal layer 308, the oxide layer 306, the 2D layer 304, the cap layer 310, and the dielectric layer 312. In embodiments, the dielectric layer 330 may be an oxide that is deposited using ALD techniques. In embodiments, the dielectric layer 330 may include aluminum oxide, hafnium oxide, zirconium oxide, titanium oxide, silicon oxide, or silicon nitride (SiNx). In embodiments, a dielectric 329, which may be similar to dielectric 129 of FIG. 1, which may include silicon oxide, may surround at least a portion of the dielectric layer 330.

In embodiments, the metal layer 308 may be electrically coupled with an electrically conductive via 332, which may be similar to electrically conductive via 132 of FIG. 1, within a metal 2 (m2) layer of the BEOL device 300. In embodiments, the conductive via 332 may be surrounded by a dielectric layer 334. In embodiments a metal contact 336, which may be similar to metal contact 136 of FIG. 1, may be at a metal 1 (m1) layer of the BEOL device 300, and electrically coupled with the conductive via 332. In embodiments, the metal contact 336 may be surrounded by dielectric 338.

In embodiments, an oxide layer 353 may be placed on a side of the source 320, the side of the drain 322, and a portion of the 2D layer 304. In embodiments, the oxide layer 353 may include $La_2O_3$, $Al_2O_3$, $TiO_2$, $HfO_2$, and/or $ZrO_2$. In embodiments, a metal 355, which may be a metal layer, and which may include copper, aluminum, cobalt, titanium nitride, and/or tungsten, may be placed on the oxide layer 353 between the source 320 and the drain 322. In embodiments, the oxide layer 353 electrically isolates the metal 355 from the source 320 and the drain 322.

In embodiments, the source 320 may be electrically coupled with a conductive via 340, and the drain 322 may be coupled with one or more metal vias 342 that electrically couple with the capacitor 372. In embodiments, the capacitor 372 may include a metal 374 that is separated by a dielectric material 376. In embodiments, the dielectric material 376 may be a high-k dielectric material. In embodiments, the metal 374 may be electrically coupled with an electrical contact 378.

Figures 4A, 4B, 4C, 4D:
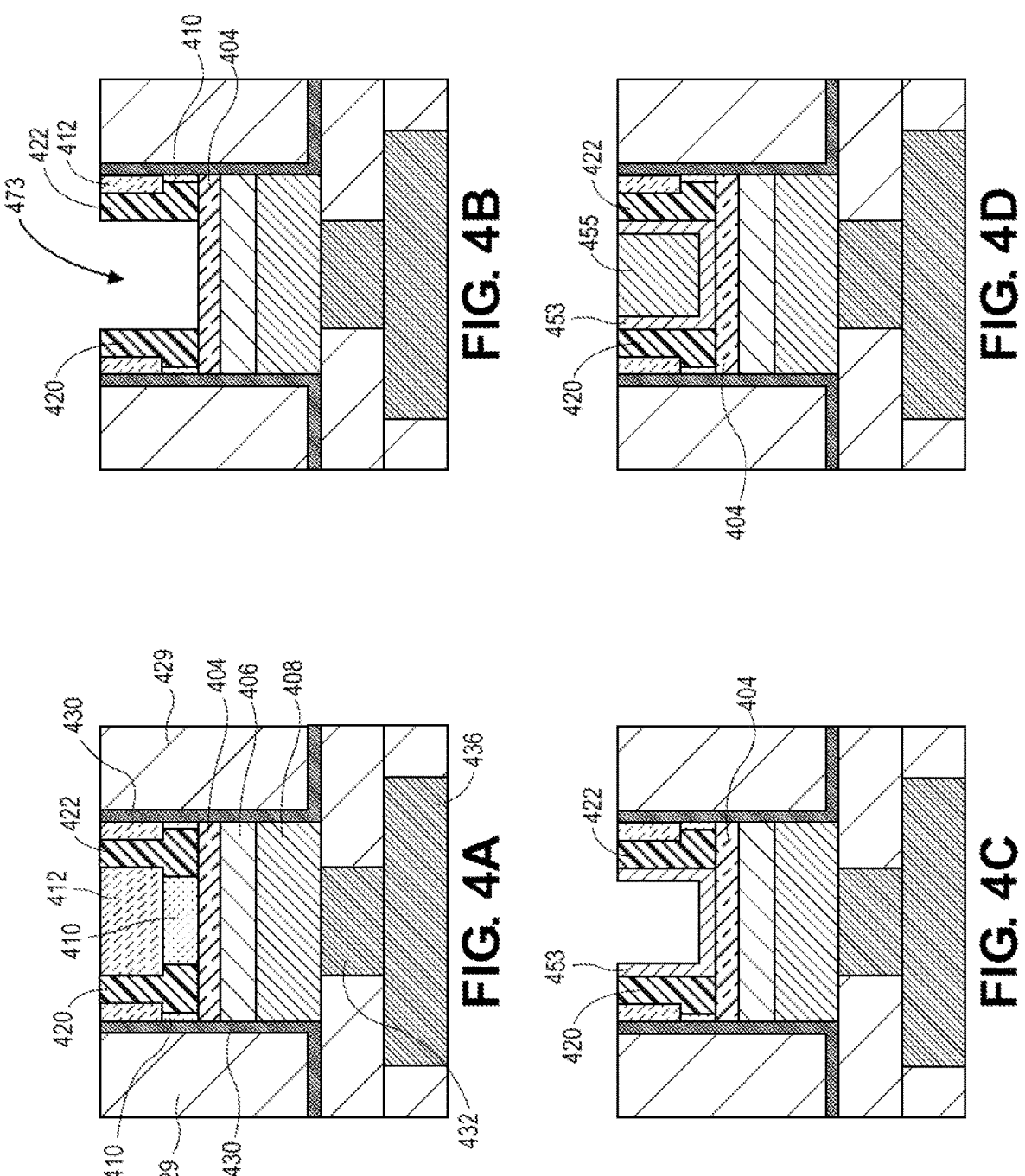
FIGS. 4A-4F illustrate cross section side views of stages in a manufacturing process for creating a BEOL transistor coupled with a capacitor to form a memory cell, in accordance with various embodiments.

FIGS. 4A-4F illustrate cross section side views of stages in a manufacturing process for creating a BEOL transistor coupled with a capacitor to form a memory cell, in accordance with various embodiments. FIG. 4A shows a cross section side view of a stage in the manufacturing process, which may be similar to the stage shown in FIG. 2G, which may be developed using manufacturing stages similar to those shown with respect to FIGS. 2A-2G. A 2D layer 404 may be on an oxide layer 406, which in turn is on a metal layer 408, which may be similar to 2D layer 304, oxide layer 306, and metal layer 308 of FIG. 3. A cap layer 410 may be on the 2D layer 404, and a dielectric layer 412 on the cap layer 410.

A source 420 and a drain 422 may extend through the dielectric layer 412 and the cap layer 410 to the 2D layer 404. In embodiments, the source 420 and the drain 422 may extend through the 2D layer 404. The cap layer 410, dielectric layer 412, source 420, and drain 422 may be similar to cap layer 310, dielectric layer 312, source 320, and drain 322 of FIG. 3.

A dielectric layer 430, which may be similar to dielectric layer 330 of FIG. 3, may at least partially surround the metal layer 408, the oxide layer 406, the 2D layer 404, the cap layer 410, and the dielectric layer 412. In embodiments, a dielectric 429, which may be similar to dielectric 329 FIG. 3, may surround at least a portion of the dielectric layer 430. In embodiments, the metal layer 408 may be on an electrically conductive via 432, which is on a metal contact 436, which may be similar to electrically conductive via 332 and metal contact 336 of FIG. 3.

FIG. 4B shows a cross section side view of a stage in the manufacturing process where a cavity 473 is formed through the dielectric layer 412 and the cap layer 410 that extends to the 2D layer 404. In embodiments, a portion of the source 420 and the drain 422 may be removed when the cavity 473 is formed. The cavity 473 may extend from the source 420 to the drain 422. In embodiments, the cavity 473 may be formed using etching techniques.

FIG. 4C shows a cross section side view of a stage in the manufacturing process where an oxide layer 453, which may be similar to oxide layer 353 of FIG. 3, is applied to a surface of the source 320, the drain 322, and a portion of the surface of the 2D layer 404. In embodiments, the oxide layer 453 may be applied using atomic layer deposition (ALD) processes.

FIG. 4D shows a cross section side view of a stage in the manufacturing process where a metal 455, which may be similar to metal 355 of FIG. 3, is applied to the oxide layer 453. In embodiments, the oxide layer 453 electrically isolates the metal 455 from the source 420, the drain 422, and the 2D layer 404. In embodiments, the metal 455 may be a gate metal, and may include copper, aluminum, cobalt, titanium nitride, or tungsten.

Figure 4F:
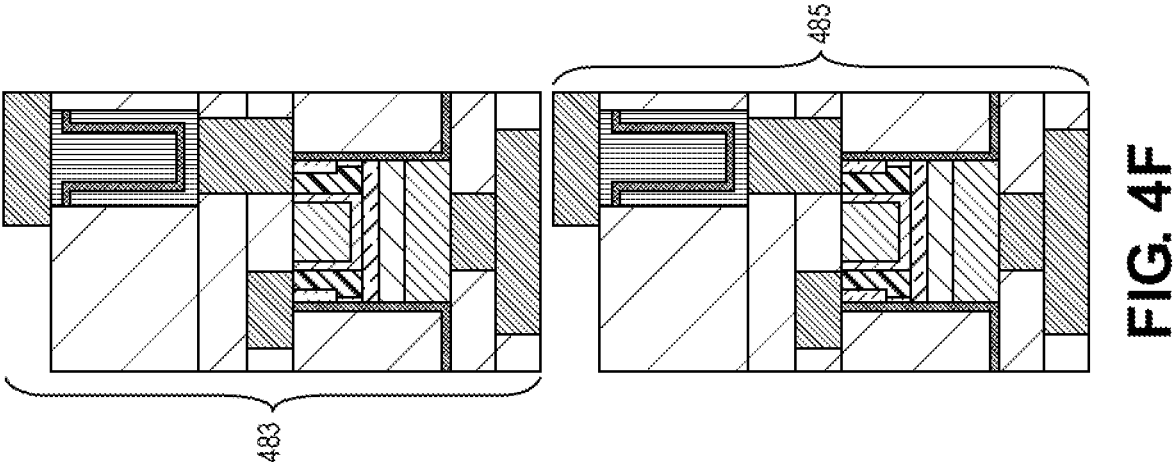
Figure 4E:
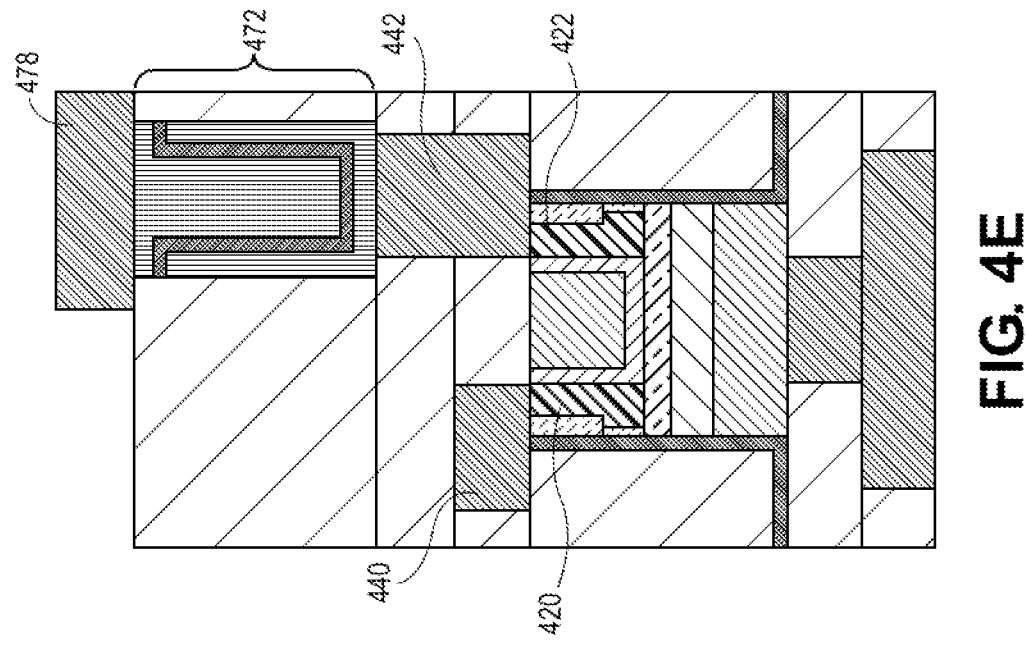

FIG. 4E shows a cross section side view of a stage in the manufacturing process where an electrically conductive via 440, which may be similar to electrically conductive via 340 of FIG. 3, is placed on the source 420, and one or more electrically conductive vias 442, which may be similar to one or more electrically conductive vias 342 of FIG. 3, are placed on the drain 422. In embodiments, a capacitor 472, which may be similar to capacitor 372 of FIG. 3, may be placed on the one or more electrically conductive vias 442 to electrically couple the capacitor 472 with the drain 422. In embodiments, an electrical contact 478, which may be similar to electrical contact 378 of FIG. 3, may be placed on the capacitor 472. Note that in embodiments, FIG. 4E is similar to BEOL device 300 of FIG. 3.

FIG. 4F shows a cross section side view of a stage in the manufacturing process where two BEOL devices 483, 485, each which may be similar to BEOL device 300 of FIG. 3, may be stacked on each other to create a layer memory.

Figure 5:
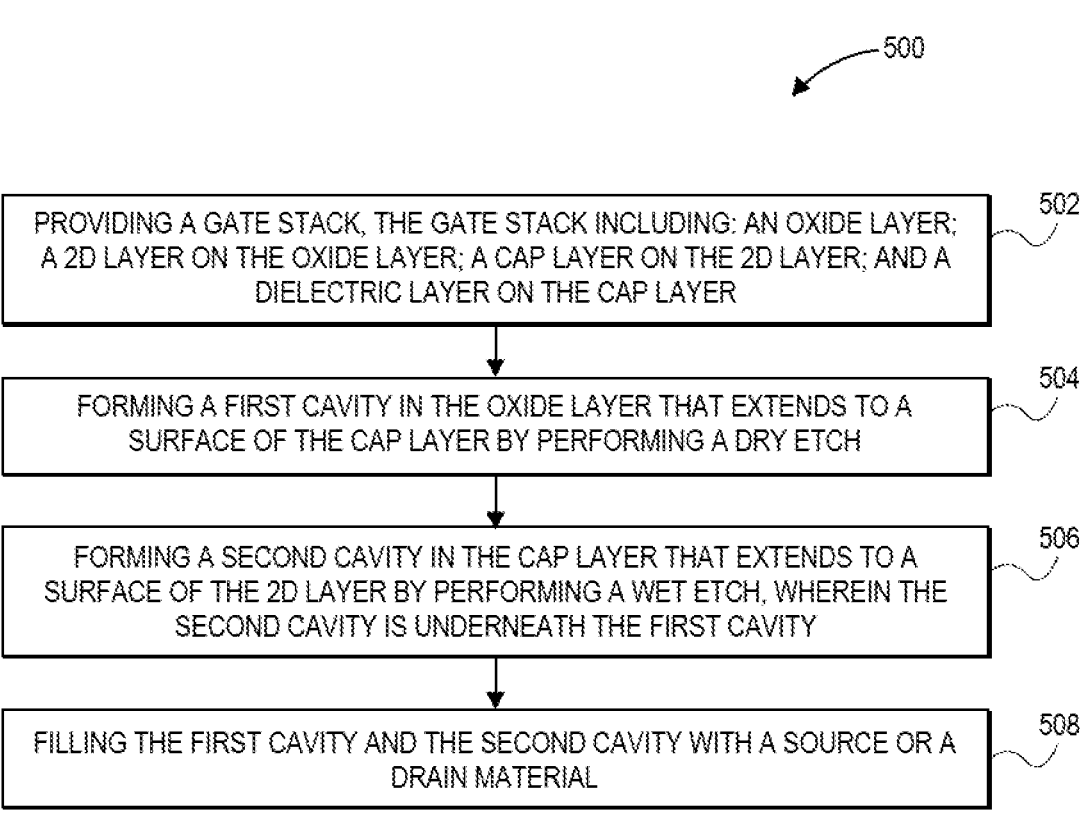
FIG. 5 illustrates an example process for manufacturing a BEOL transistor that may be coupled with a capacitor to form a memory cell, in accordance with various embodiments.

FIG. 5 illustrates an example process for manufacturing a BEOL transistor that may be coupled with a capacitor to form a memory cell, in accordance with various embodiments. Process 500 may be performed using the systems, apparatus, techniques, and/or process as described herein, and in particular with respect to FIGS. 1-4F.

At block 502 the process may include providing a gate stack, the gate stack including: an oxide layer; a 2D layer on the oxide layer; a cap layer on the 2D layer; and a dielectric layer on the cap layer. In embodiments, the oxide layer may be similar to oxide layer 106, the cap layer may be similar to cap layer 110, the 2D layer may be similar to 2D layer 104, and the dielectric layer may be similar to dielectric layer 112 of FIG. 1.

At block 504, the process may further include forming a first cavity in the oxide layer that extends to a surface of the cap layer by performing a dry etch. In embodiments, the first cavity may be similar to cavity 231 or cavity 233 of FIG. 2E.

At block 506, the process may further include forming a second cavity in the cap layer that extends to a surface of the 2D layer by performing a wet etch, wherein the second cavity is underneath the first cavity. In embodiments, the second cavity may be similar to cavity 235 or cavity 237 of FIG. 2F.

At block 508, the process may further include filling the first cavity and the second cavity with a source or a drain material. In embodiments, the source may be similar to source 220 and the drain may be similar to drain 222 of FIG. 2.

Figure 6:
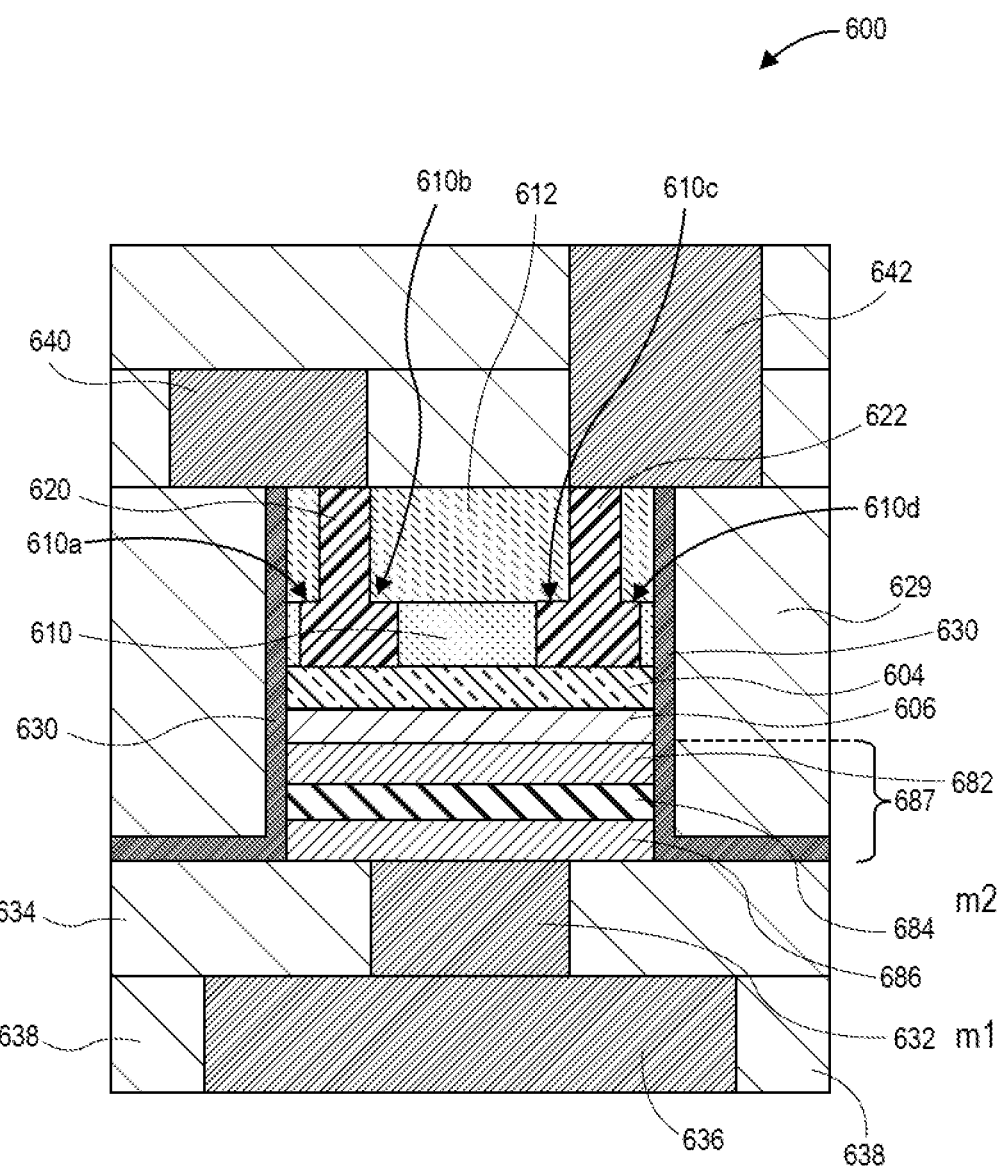
FIG. 6 shows a cross section side view of a BEOL transistor that functions as a memory cell, in accordance with various embodiments.

FIG. 6 shows a cross section side view of a BEOL transistor that functions as a memory cell, in accordance with various embodiments. BEOL device 600 includes a 2D layer 604, which may also be referred to as a nano-ribbon. The 2D layer 604 may be a TMD monolayer. The 2D layer 604 may be grown on an oxide layer 606, which may include silicon dioxide.

In embodiments, the oxide layer 606 may be on a MFMIS structure 687 that includes a first metal layer 686 below a ferroelectric layer 684 that is below a second metal layer 682. In embodiments, the first metal layer 686 and the second metal layer 682 may include a gate metal such as copper, aluminum, cobalt, titanium nitride, or tungsten.

In embodiments, the ferroelectric layer 684 may include hafnium oxide, hafnium zirconium oxide, zirconium oxide, La—HZO, and/or a perovskite oxide such as $BaTiO_3$. In embodiments, the first metal layer 686 may be electrically coupled with an electrically conductive via 632 within a metal 2 (m2) layer of the BEOL device 600. In embodiments, the conductive via 632 may be surrounded by a dielectric layer 634. In embodiments a metal contact 636 may be at a metal 1 (m1) layer of the BEOL device 600, and electrically coupled with the conductive via 632. In embodiments, the metal contact 636 may be surrounded by dielectric 638.

Above the 2D layer 604 there may be a cap layer 610, and a dielectric layer 612 above the cap layer 610. In embodiments, the cap layer 610 may include Al, La, Hf, Ti, 0, $Al_2O_3$, $La_2O_3$, $HfO_2$, and/or $TiO_2$. In embodiments, the dielectric layer 612 may include silicon nitride.

In embodiments, a source 620 and a drain 622 may extend through the dielectric layer 612 and the cap layer 610 and come into physical contact with the 2D layer 604. In embodiments, the source 620 and/or the drain 622 may extend into the 2D layer 604. In embodiments, as discussed further below, a dry etch process may be used to etch a cavity within the dielectric layer 612, and a wet etch process may be used to etch a cavity within the cap layer 610 into which the source 620 or the drain 622 may be inserted. In embodiments, the wet etch process may result in etched portions of the cap layer 610*a*, 610*b*, 610*c*, 610*d* created underneath a side of the dielectric layer 612. As a result, when the source 620 and the drain 622 are inserted, portions of the source 620 and the drain 622 may fill into the etched portions of the cap layer 610*a*, 610*b*, 610*c*, 610*d* as shown.

In embodiments, a dielectric layer 630, which may be a high-k dielectric layer or an oxide layer, may at least partially surround the first metal layer 686, ferroelectric layer 684, second metal layer 682, oxide layer 606, the 2D layer 604, the cap layer 610, and the dielectric layer 612. In embodiments, the dielectric layer 630 may be an oxide that is deposited using ALD techniques. In embodiments, the dielectric layer 630 may include aluminum oxide, hafnium oxide, zirconium oxide, titanium oxide, silicon oxide, silicon nitride (SiNx), $Al_2O_3$, $La_2O_3$, $HfO_2$, $TiO_2$, and/or $ZrO_2$. In embodiments, a dielectric 629, which may include silicon oxide, may surround at least a portion of the dielectric layer 630.

In embodiments, the source 620 may be electrically coupled with a conductive via 640, and the drain 622 may be coupled with one or more metal vias 642 to provide an electrical connection with the BEOL device 600.

Figure 7I:
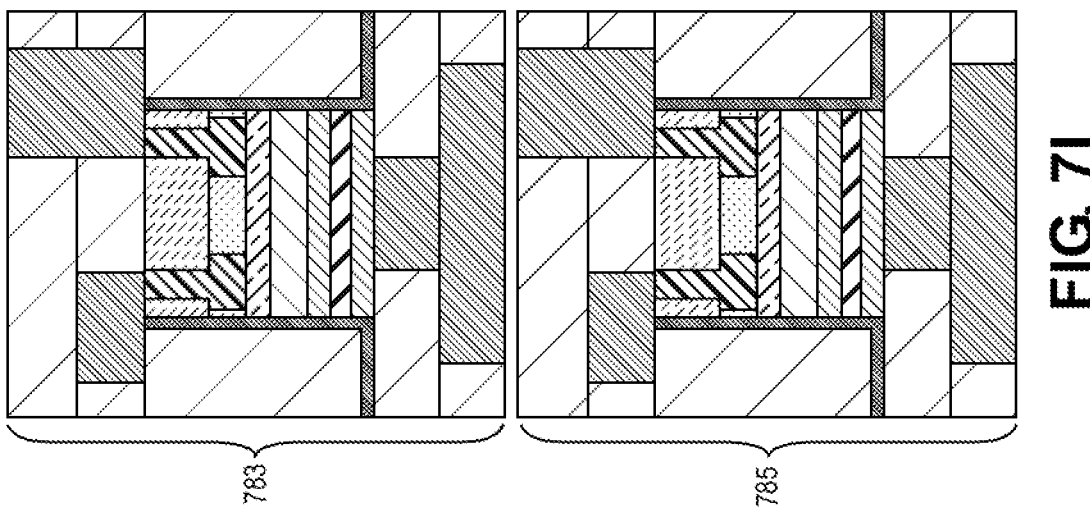

FIGS. 7A-7I illustrate cross section side views of stages in a manufacturing process for creating a BEOL transistor that functions as a memory cell, in accordance with various embodiments. FIG. 7A shows a cross section side view of a stage in the manufacturing process where a partial gate stack 703 is provided. Partial gate stack 703 includes a metal contact 736 that may be surrounded by dielectric 738, and a conductive via 732 which may be on the metal contact 736 and surrounded by dielectric 734. In embodiments, metal contact 736, dielectric 738 conductive via 732 and dielectric 734 may be similar to metal contact 636, dielectric 638, connected via 632, and dielectric 634 of FIG. 6.

A first metal layer 786 may be on the conductive via 732. A ferroelectric layer 784 may be on the first metal layer 786, and a second metal layer 782 may be on the ferroelectric layer 784. An oxide layer 706 may be on the second metal layer 782, and a 2D layer 704 may be on the oxide layer 706. A cap layer 710 may be on the 2D layer 704, and a dielectric layer 712 may be on the cap layer 710. In embodiments, the first metal layer 786, ferroelectric layer 784, second metal layer 782, the oxide layer 706, the 2D layer 704, the cap layer 710 and the dielectric layer 712 may be similar to first metal layer 686, ferroelectric layer 684, second metal layer 682, oxide layer 606, 2D layer 604, cap layer 610, and dielectric layer 612 of FIG. 6.

FIG. 7B shows a cross section side view of a stage in the manufacturing process where cavities 741 are formed down to the dielectric 734. In embodiments, the cavities 741 may be formed using an etch process, which may be a dry etch. Subsequently, a dielectric layer 730, which may also be referred to as an oxide layer, may be applied to the structure. In embodiments, the dielectric layer 730 may be similar to dielectric layer 630 of FIG. 6. In embodiments, a thickness of the dielectric layer 730 may range from 1 nm to 10 nm.

FIG. 7C shows a cross section side view of a stage in the manufacturing process where a dielectric 729, which may be similar to dielectric 629 of FIG. 6, may be applied on the dielectric layer 730.

FIG. 7D shows a cross section side view of a stage in the manufacturing process where the dielectric 729 is polished down to the surface of the dielectric layer 712. In embodiments, the polishing removes a top portion of the dielectric layer 730.

FIG. 7E shows a cross section side view of a stage in the manufacturing process where cavities 731, 733 are formed within the dielectric layer 712. In embodiments, a dry etch process is used to form the cavities 731, 733. In embodiments, the dry etch process stops at the cap layer 710.

FIG. 7F shows a cross section side view of a stage in the manufacturing process where cavities 735, 737 are formed within the cap layer 710 down to a surface of the 2D layer 704. In embodiments, a wet etch process is used to create cavities 735, 737. In embodiments, a wet etch process will not damage the 2D layer 704. Using a dry etch process to form cavities 735, 737 would damage the 2D layer 704.

In embodiments, the wet etch will also etch into the cap layer 710 into etched portions of the cap layer 710*a*, 710*b*, 710*c*, 710*d* underneath a surface of the dielectric layer 712. As a result, the cavities 735, 737 may be wider than the cavities 731, 733 of FIG. 7E that were created using a dry etch process.

FIG. 7G shows a cross section side view of a stage in the manufacturing process where a source 720 and a drain 722, which may be similar to source 620 and drain 622 of FIG. 6, are formed by inserting material into the cavities 731, 733 of FIG. 7E, and into the cavities 735, 737 of FIG. 7F. In embodiments, the source 720 and the drain 722 will come into contact with the 2D layer 704. In embodiments, the source 720 and the drain 722 may extend into the 2D layer 704.

Figure 7H:
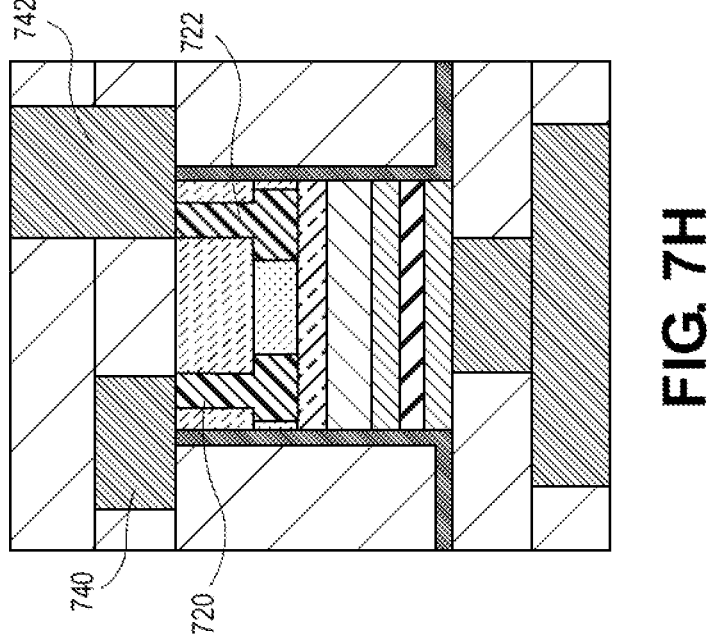

FIG. 7H shows a cross section side view of the stage in the manufacturing process where an electrically conductive via 740, which may be similar to electrically conductive via 640 of FIG. 6, is placed on the source 720. One or more electrically conductive vias 742, which may be similar to the one or more electrically conductive vias 642 of FIG. 6, are placed on the drain 722. Note that in embodiments, FIG. 7H may be similar to BEOL device 600 of FIG. 6.

FIG. 7I shows a cross section side view of a stage in the manufacturing process where two BEOL devices 783, 785, each which may be similar to BEOL device 600 of FIG. 6, may be stacked on each other to create a layer memory.

Figure 8:
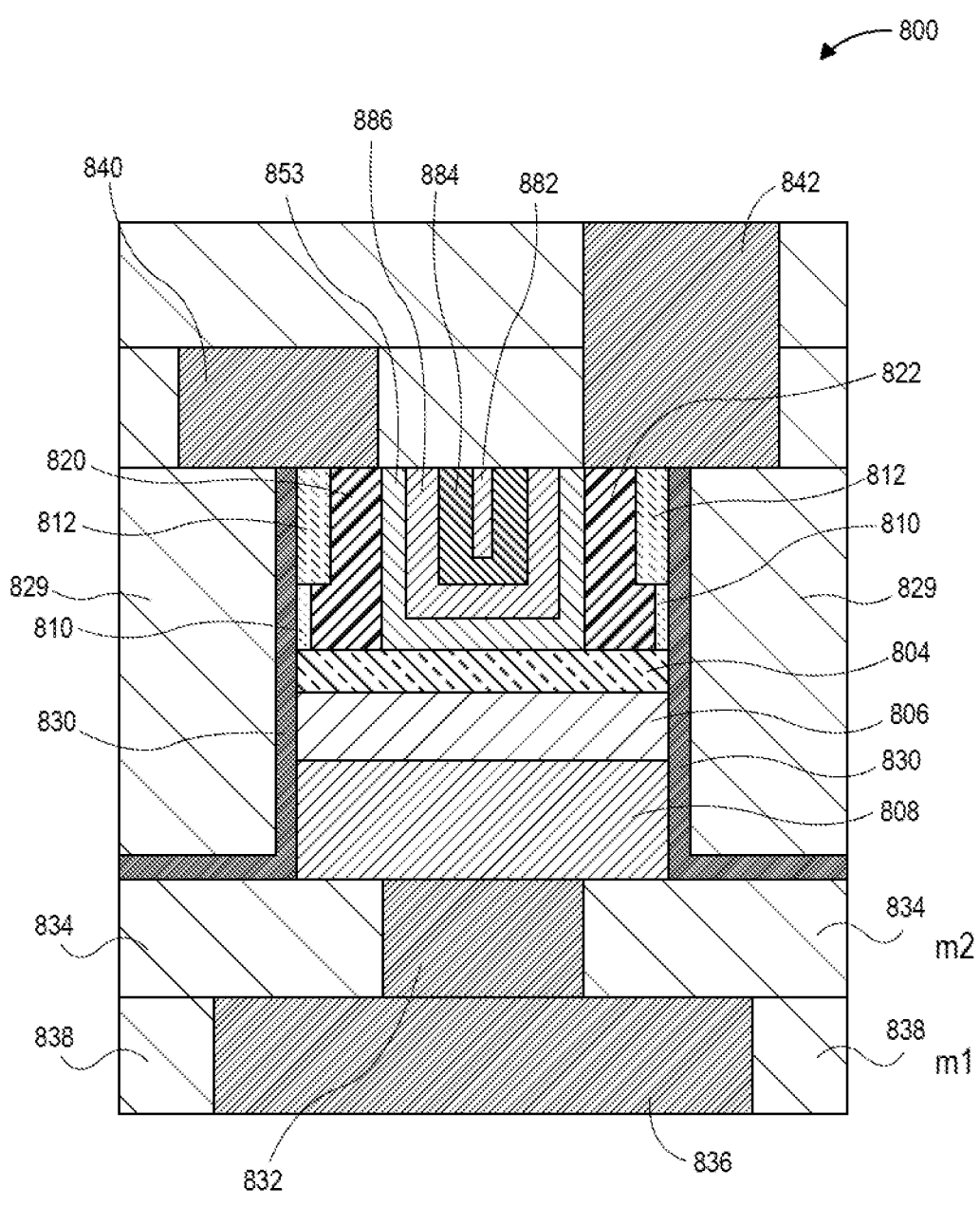
FIG. 8 shows a cross section side view of another BEOL transistor that functions as a memory cell, in accordance with various embodiments.

FIG. 8 shows a cross section side view of another BEOL transistor that functions as a memory cell, in accordance with various embodiments. BEOL device 800, which may be similar to BEOL device 600 of FIG. 6, includes a 2D layer 804, which may also be referred to as a nano-ribbon. The 2D layer 804 may be a TMD monolayer. In embodiments, the 2D layer 804 may be grown on an oxide layer 806, which may include silicon dioxide. In embodiments, the oxide layer 806 may be on a metal layer 808, which may include copper, aluminum, cobalt, titanium nitride, or tungsten.

Above the 2D layer 804 there may be a cap layer 810, and a dielectric layer 812 above the cap layer 810. In embodiments, the cap layer 810 may include Al, La, Hf, Ti, 0, $Al_2O_3$, $La_2O_3$, $HfO_2$, and/or $TiO_2$. In embodiments, the dielectric layer 812 may include silicon nitride. In embodiments, the 2D layer 804, the oxide layer 806, the metal layer 808, the cap layer 810, and the dielectric layer 812 may be similar to 2D layer 604, the oxide layer 606, the metal layer 608, the cap layer 610, and the dielectric layer 612 of FIG. 6.

In embodiments, a source 820 and a drain 822, which may be similar to source 620 and drain 622 of FIG. 6, may extend through the dielectric layer 812 and the cap layer 810 to come into physical contact with the 2D layer 804. In embodiments, the source 820 and/or the drain 822 may extend into the 2D layer 804. In embodiments, as described below, a wet etch process may be used to etch a cavity within the cap layer 810 into which the source 820 or the drain 822 may be inserted. In embodiments, the wet etch process may result in etched portions of the cap layer (discussed below) to be created underneath a side of the dielectric layer 812. As a result, when the source 820 and the drain 822 are inserted, portions of the source 820 and the drain 822 may fill in underneath the side of the dielectric layer 812.

In embodiments, a dielectric layer 830, which may be similar to dielectric layer 630 of FIG. 6, may at least partially surround the metal layer 808, the oxide layer 806, the 2D layer 804, the cap layer 810, and the dielectric layer 812. In embodiments, the dielectric layer 830 may be an oxide that is deposited using ALD techniques. In embodiments, the dielectric layer 830 may include aluminum oxide, hafnium oxide, zirconium oxide, titanium oxide, silicon oxide, or silicon nitride (SiNx). In embodiments, a dielectric 829, which may be similar to dielectric 629 of FIG. 6, which may include silicon oxide, may surround at least a portion of the dielectric layer 830.

In embodiments, the metal layer 808 may be electrically coupled with an electrically conductive via 832, which may be similar to electrically conductive via 632 of FIG. 6, within a metal 2 (m2) layer of the BEOL device 800. In embodiments, the electrically conductive via 832 may be surrounded by a dielectric layer 834. In embodiments a metal contact 836, which may be similar to metal contact 636 of FIG. 6, may be at a metal 1 (m1) layer of the BEOL device 800, and may be electrically coupled with the electrically conductive via 832. In embodiments, the metal contact 836 may be surrounded by dielectric 838.

In embodiments, an oxide layer 853 may be placed on a side of the source 820, the side of the drain 822, and a portion of the 2D layer 804. In embodiments, the oxide layer 853 may include Al, La, Hf, Ti, O, $Al_2O_3$, $La_2O_3$, $HfO_2$, and/or $TiO_2$. In embodiments, a metal layer 886, which may include copper, aluminum, cobalt, titanium nitride, and/or tungsten, may be placed on the oxide layer 853 between the source 820 and the drain 822. In embodiments, the oxide layer 853 electrically isolates the metal layer 886 from the source 820 and the drain 822.

In embodiments, a ferroelectric layer 884, which may be similar to ferroelectric layer 684 of FIG. 6, may be placed on the metal layer 886. A metal layer 882, which may be similar to metal layer 886, may be placed on the ferroelectric layer 884.

In embodiments, the source 820 may be electrically coupled with a conductive via 840, and the drain 822 may be coupled with one or more electrically conductive vias 842 to provide an electrical contact with the BEOL device 800.

Figures 9A, 9B, 9C:
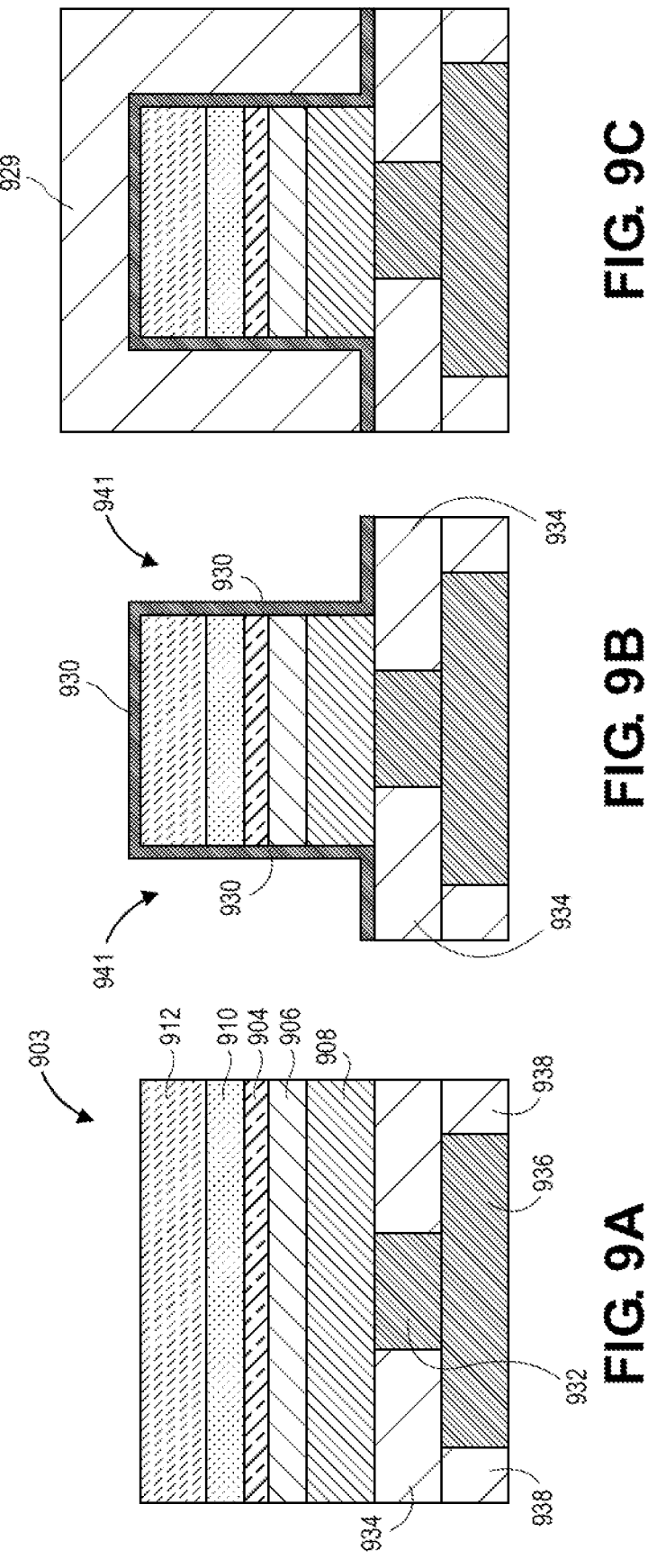
FIGS. 9A-9N illustrate cross section side views of stages in another manufacturing process for creating a BEOL transistor that functions as a memory cell, in accordance with various embodiments.
Figures 9D, 9E, 9F:
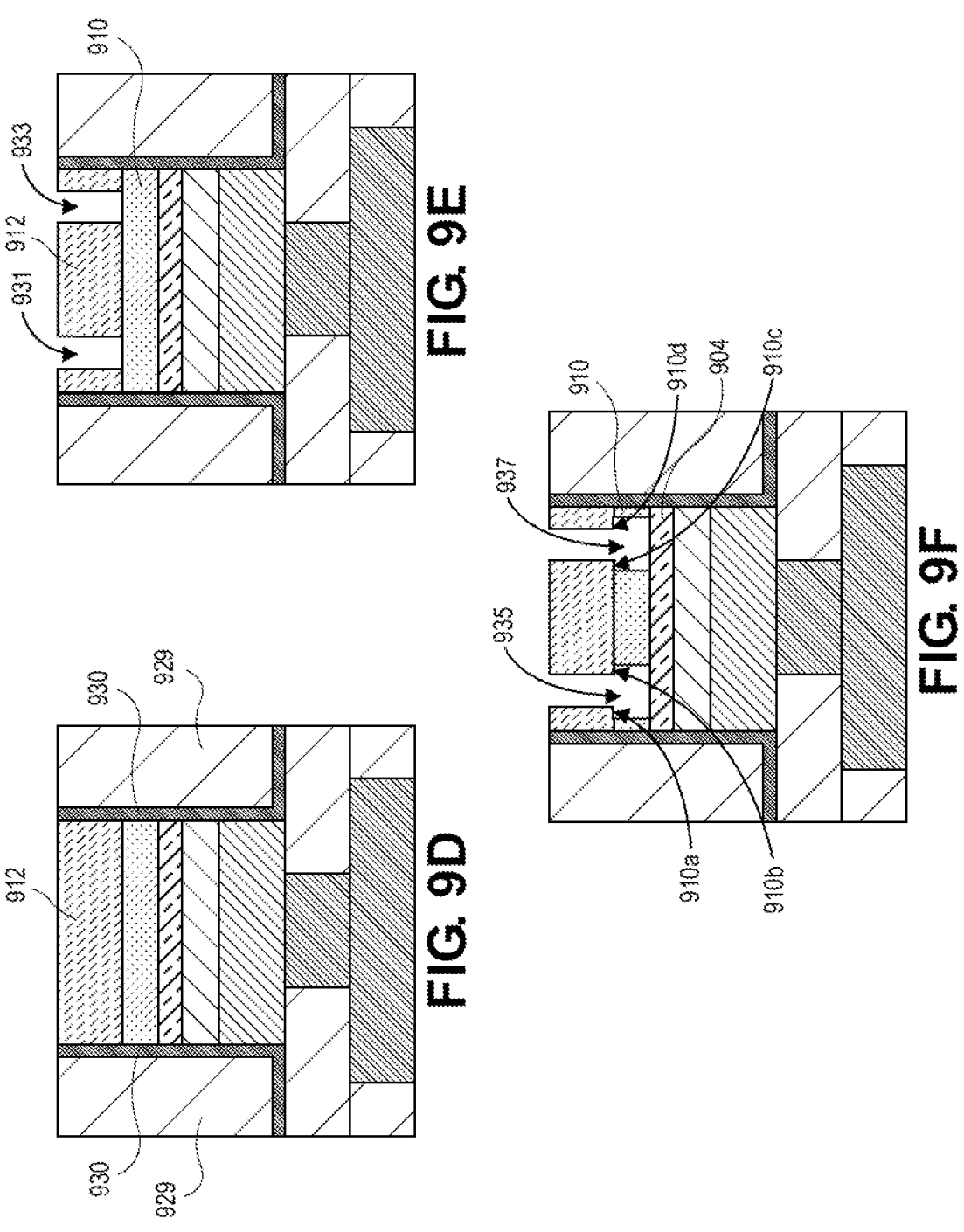
Figures 9G, 9H, 9I, 9J, 9K, 9L:
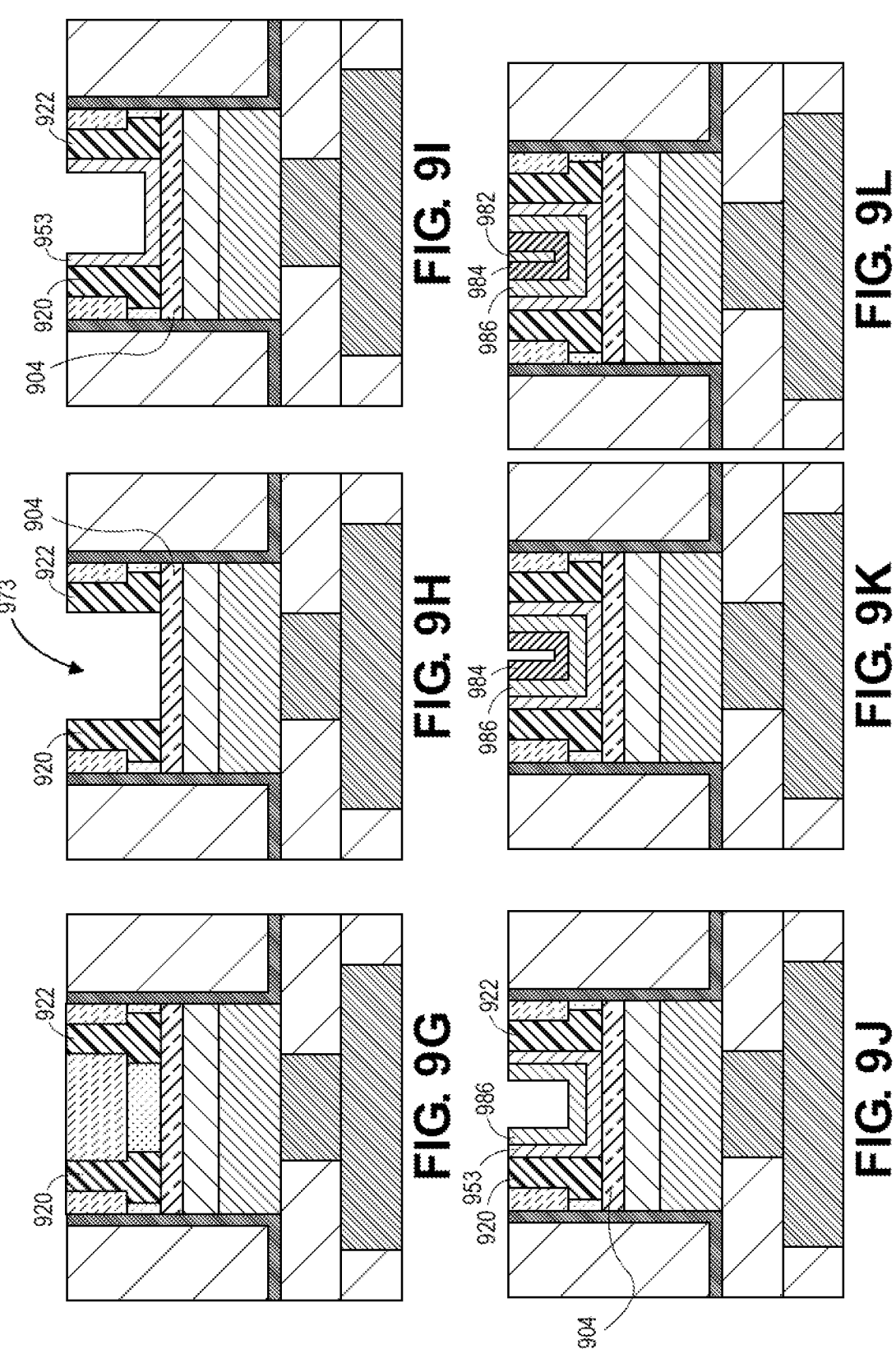
Figure 9N:
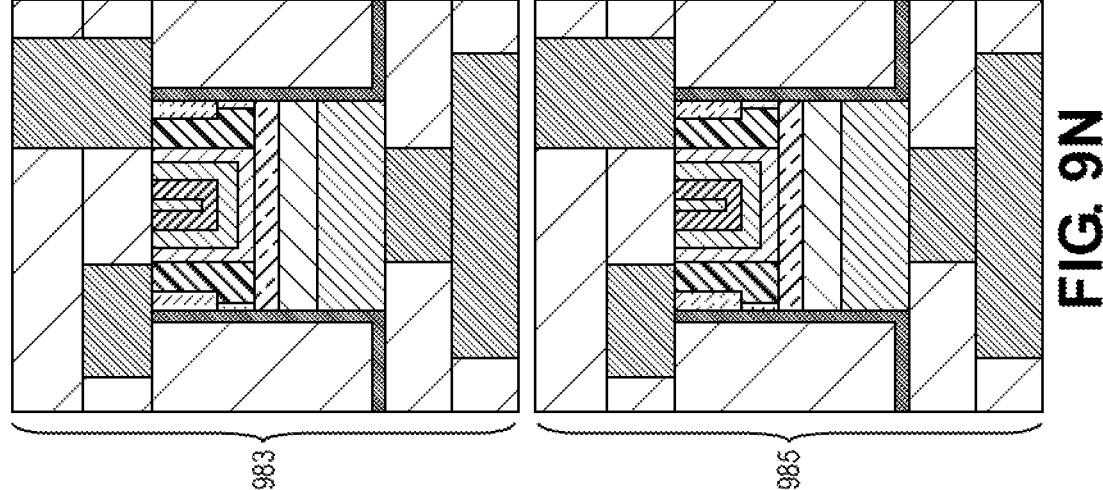

FIGS. 9A-9N illustrate cross section side views of stages in another manufacturing process for creating a BEOL transistor that functions as a memory cell, in accordance with various embodiments. FIG. 9A shows a cross section side view of a stage in the manufacturing process where a partial gate stack 903 is provided. Partial gate stack 903 includes a metal contact 936 that may be surrounded by dielectric 938, and a conductive via 932 which may be on the metal contact 936 and surrounded by dielectric 934. In embodiments, metal contact 936, dielectric 938, and conductive via 932, and dielectric 934 may be similar to metal contact 836, dielectric 838, electrically conductive via 832, and dielectric 834 of FIG. 8.

A metal layer 908 may be on the conductive via 932. An oxide layer 906 may be on the metal layer 908, and a 2D layer 904 may be on the oxide layer 906. A cap layer 910 may be on the 2D layer 904, and a dielectric layer 912 may be on the cap layer 910. In embodiments, the metal layer 908, the oxide layer 906, the 2D layer 904, the cap layer 910 and the dielectric layer 912 may be similar to metal layer 808, oxide layer 806, 2D layer 804, cap layer 810, and dielectric layer 812 of FIG. 8.

FIG. 9B shows a cross section side view of a stage in the manufacturing process where cavities 941 are formed down to the dielectric 934. In embodiments, the cavities 941 may be formed using an etch process, which may include a dry etch. Subsequently, a dielectric layer 930, which may also be referred to as an oxide layer, may be applied to the structure. In embodiments, the dielectric layer 930 may be similar to dielectric layer 830 of FIG. 8. In embodiments, a thickness of the dielectric layer 930 may range 1 nm to 10 nm.

FIG. 9C shows a cross section side view of a stage in the manufacturing process where a dielectric 929, which may be similar to dielectric 829 of FIG. 8, may be applied on the dielectric layer 930.

FIG. 9D shows a cross section side view of a stage in the manufacturing process where the dielectric 929 is polished down to the surface of the dielectric layer 912. In embodiments, the polishing removes a top portion of the dielectric layer 930.

FIG. 9E shows a cross section side view of a stage in the manufacturing process where cavities 931, 933 are formed within the dielectric layer 912. In embodiments, a dry etch process is used to form the cavities 931, 933. In embodiments, the dry etch process stops at the cap layer 910.

FIG. 9F shows a cross section side view of a stage in the manufacturing process where cavities 935, 937 are formed within the cap layer 910, down to a surface of the 2D layer 904. In embodiments, a wet etch process is used to create cavities 935, 937. In embodiments, a wet etch process will not damage the 2D layer 904. Using a dry etch process to form cavities 935, 937 would damage the 2D layer 904.

In embodiments, the wet etch will also etch into the cap layer 910 into etched portions of the cap layer 910a, 910b, 910c, 910d underneath a surface of the dielectric layer 912. As a result, the cavities 935, 937 may be wider than the cavities 931, 933 of FIG. 9E that were created using a dry etch process.

FIG. 9G shows a cross section side view of a stage in the manufacturing process where a source 920 and a drain 922, which may be similar to source 820 and drain 822 of FIG. 8, are formed by inserting material into the cavities 931, 933 of FIG. 9E, and into the cavities 935, 937 of FIG. 9F. In embodiments, the source 920 and the drain 922 will come into contact with the 2D layer 904. In embodiments, the source 920 and the drain 922 may extend into the 2D layer 904.

FIG. 9H shows a cross section side view of a stage in the manufacturing process where a cavity 973 is formed between the source 920 and the drain 922, and extends to a surface of the 2D layer 904. In embodiments, the cavity may be formed by an etching technique.

FIG. 9I shows a cross section side view of a stage in the manufacturing process where an oxide layer 953 is placed within the cavity 973, and adjacent to the source 920, the drain 922, and the surface of the 2D layer 904. In embodiments, the oxide layer 953 may be similar to oxide layer 853 of FIG. 8.

FIG. 9J shows a cross section side view of a stage in the manufacturing process where a metal layer 986 is placed on the oxide layer 953, between the source 920 and the drain 922, and above the 2D layer 904. In embodiments, the metal layer 986 may be similar to metal layer 886 of FIG. 8.

FIG. 9K shows a cross section side view of a stage in the manufacturing process where a ferroelectric layer 984, which may be similar to ferroelectric layer 884 of FIG. 8, is placed on the metal layer 986.

FIG. 9L shows a cross section side view of a stage in the manufacturing process where a metal layer 982, which may be similar to metal layer 882 of FIG. 8, is placed on the ferroelectric layer 984. In embodiments, the metal layer 982 may completely fill a volume that is surrounded by the ferroelectric layer 984. In embodiments, the metal layer 986, ferroelectric layer 984, and metal layer 982 may form a portion of a MFMIS structure, where the portion may be referred to as a MFM memory part.

Figure 9M:
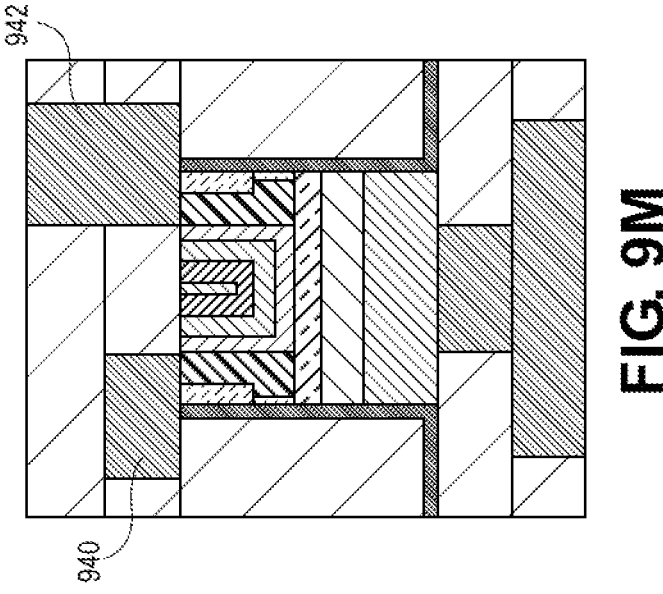

FIG. 9M shows a cross section side view of the stage in the manufacturing process where an electrically conductive via 940, which may be similar to electrically conductive via 840 of FIG. 8, is placed on the source 920. One or more electrically conductive vias 942, which may be similar to the one or more electrically conductive vias 842 of FIG. 8, are placed on the drain 922. Note that in embodiments, FIG. 9M is similar to BEOL device 800 of FIG. 8.

FIG. 9N shows a cross section side view of a stage in the manufacturing process where two BEOL devices 983, 985, each which may be similar to BEOL device 800 of FIG. 8, may be stacked on each other to create a layer memory.

FIG. 10 illustrates an example process for manufacturing a BEOL transistor that functions as a memory cell, in accordance with various embodiments. Process 1000 may be performed using any of the systems, apparatus, techniques, or processes described herein, and in particular with respect to FIGS. 6-9N.

At block 1002, the process may include providing a gate stack, the gate stack including: a metal layer; an oxide layer on the metal layer; a 2D layer on the oxide layer; a cap layer on a surface of the 2D layer; and a dielectric layer on the cap layer. In embodiments, the metal layer may be similar to metal layer 808, the oxide layer may be similar to oxide layer 806, the 2D layer may be similar to 2D layer 804, the cap layer may be similar to cap layer 810, and the dielectric layer may be similar to dielectric layer 812 of FIG. 8.

At block 1004, the process may further include forming a first cavity in the oxide layer that extends to a surface of the cap layer by performing a dry etch. In embodiments, the first cavity may be similar to cavity 931 of FIG. 9E.

At block 1006, the process may further include forming a second cavity in the cap layer that extends to a surface of the 2D layer by performing a wet etch, wherein the second cavity is underneath the first cavity. In embodiments, the second cavity may be similar to cavity 933 of FIG. 9E.

At block 1008, the process may further include filling the first cavity and the second cavity with a source or a drain material. In embodiments, the source or drain material may be similar to source 920 or drain 922 of FIG. 9G.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV.

For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 11:
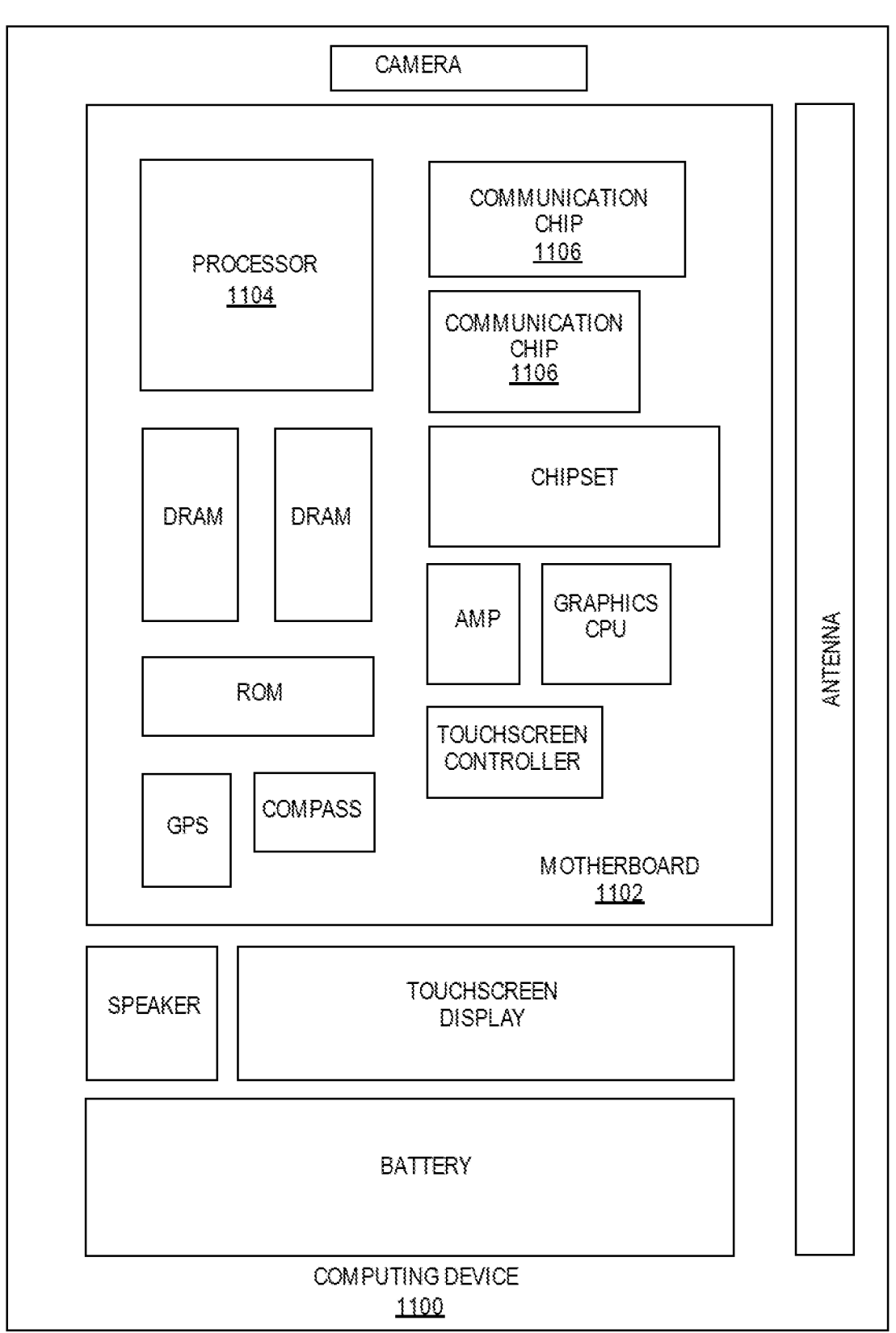
FIG. 11 illustrates a computing device in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip includes one or more devices, such as MOS-FET transistors built in accordance with implementations of the invention.

In further implementations, another component housed within the computing device 1100 may contain an integrated circuit die that includes one or more devices, such as MOS-FET transistors built in accordance with implementations of the invention.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
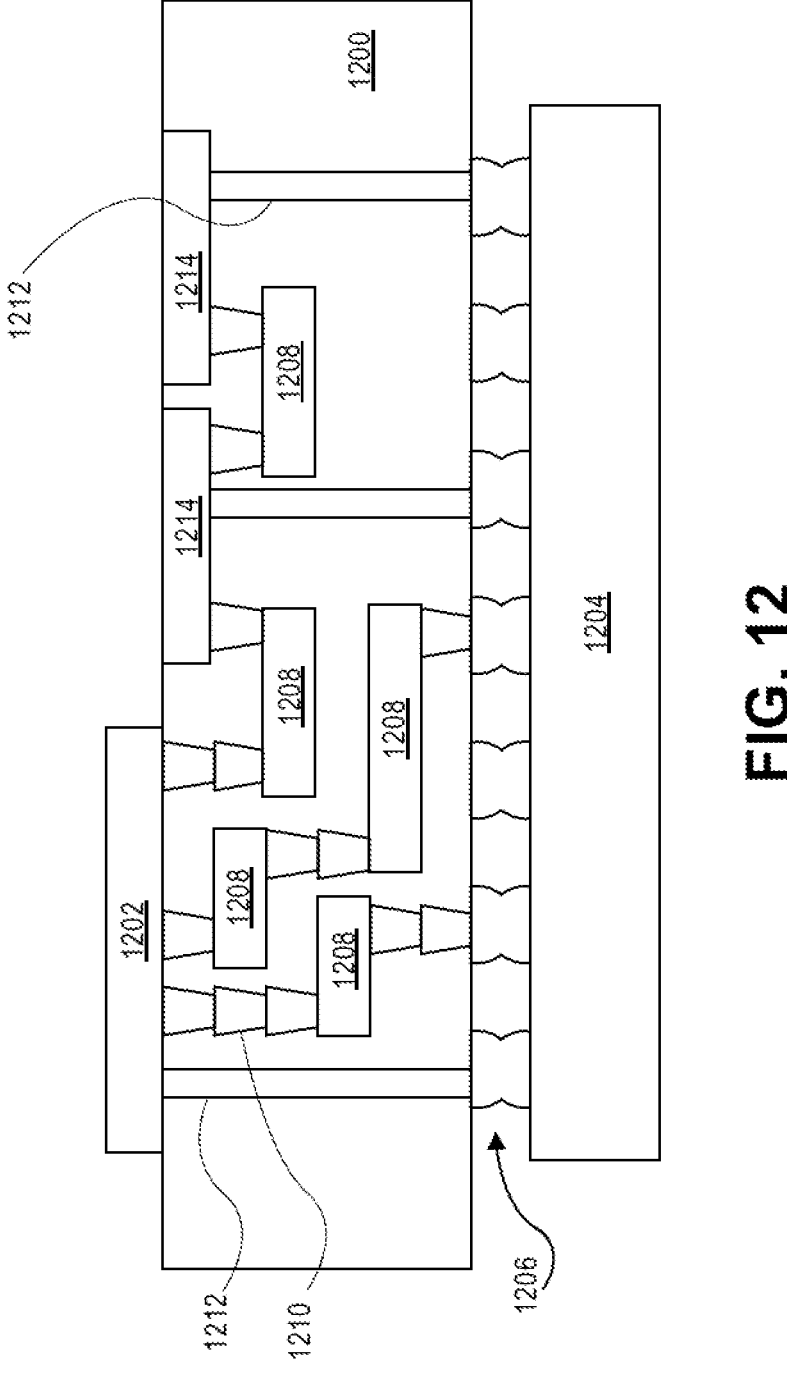
FIG. 12 illustrates an interposer that includes one or more embodiments of the invention.

FIG. 12 illustrates an interposer 1200 that includes one or more embodiments of the invention. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the invention, apparatuses or processes disclosed herein may be used in the fabrication of interposer 1200.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor structure comprising: a 2D layer (104); a cap layer (110) with a first side and a second side opposite the first side, wherein the first side of the cap layer (110) is on a surface of the 2D layer (104); a dielectric layer (112), wherein a side of the dielectric layer (112) is on the second side of the cap layer (110); a source (120) that extends through the dielectric layer (112) and through the cap layer (110) to the surface of the 2D layer (104); a drain (122) that extends through the dielectric layer (112) and through the cap layer (110) to the surface of the 2D layer (104); and wherein a portion of the source (120) extends along a first portion of the side of the dielectric layer (112), wherein a portion of the drain (122) extends along a second portion of the side of the dielectric layer (112), and wherein a portion of the cap layer (110) is between the portion of the source (120) and the portion of the drain (122).

Example 2 includes the transistor structure of example 1, or of any other example or embodiment herein, wherein the source (120) and the drain (122) are substantially perpendicular to a plane of the surface of the 2D layer (104).

Example 3 includes the transistor structure of example 1, or of any other example or embodiment herein, wherein the source (120) and the drain (122) are substantially parallel to each other.

Example 4 may include the transistor structure of example 1, or of any other example or embodiment herein, wherein the source (120) and the drain (122) extend into the 2D layer (104).

Example 5 may include the transistor structure example 1, or of any other example or embodiment herein, wherein the cap layer (110) includes a selected one or more of: Al, La, Hf, Ti, Zr, O, $Al_2O_3$, $La_2O_3$, $HfO_2$, $ZrO_2$, and/or $TiO_2$.

Example 6 includes the transistor structure of example 1, or of any other example or embodiment herein, wherein the dielectric layer (112) includes a selected one or more of: silicon, oxygen, or nitrogen.

Example 7 includes the transistor structure of example 1, or of any other example or embodiment herein, further comprising an oxide layer (106); and wherein the 2D layer (104) is on the oxide layer (106).

Example 8 includes the transistor structure of example 7, or of any other example or embodiment herein, further comprising a metal layer (108); and wherein the oxide layer (106) is on the metal layer (108).

Example 9 includes the transistor structure of example 8, or of any other example or embodiment herein, wherein the metal layer (108) is a gate metal that includes a selected one or more of: copper, aluminum, cobalt, titanium, nitrogen, or tungsten.

Example 10 includes the transistor structure of example 8, or of any other example or embodiment herein, wherein the oxide layer (106) is a first oxide layer (106); and further comprising: a second oxide layer (130) that is substantially perpendicular to the surface of the 2D layer (104), wherein the second oxide layer (130) at least partially surrounds the source (120), the drain (122), the dielectric layer (112), the 2D layer (104), the first oxide layer (106), and the metal layer (108).

Example 11 includes the transistor structure of example 8, or of any other example or embodiment herein, wherein the metal layer (108) is on an electrically conductive via (132).

Example 12 includes the transistor structure of example 1, or of any other example or embodiment herein, further comprising a capacitor structure (172) on the transistor structure, wherein the capacitor structure (172) is electrically coupled with the drain (122).

Example 13 includes the transistor structure of example 12, or of any other example or embodiment herein, wherein the transistor structure is a plurality of transistor structures, wherein the capacitor structure is a plurality of capacitor structures, and wherein the plurality of transistor structures and capacitor structures are physically coupled with each other.

Example 14 is a transistor structure comprising: a 2D layer (304); a cap layer (310) with a first side and a second side opposite the first side, wherein the first side of the cap layer (310) is on a surface of the 2D layer (304); a dielectric layer (312), wherein a side of the dielectric layer (312) is on the second side of the cap layer (310); a source (320) that extends through the dielectric layer (312) and through the cap layer (310) to the surface of the 2D layer (304); a drain (322) that extends through the dielectric layer (312) and through the cap layer (310) to the surface of the 2D layer (304); an oxide layer (353) on the surface of the 2D layer (304), the oxide layer (353) between the source (320) and the drain (322) and physically coupled with the source (320) and the drain (322); a metal layer (355) on the oxide layer (353), wherein the oxide layer (353) electrically isolates the metal layer (355) from the 2D layer (304), the source (320), and the drain (322); and wherein a first portion of the source (320) extends along a first portion of the side of the dielectric layer (312), and wherein a first portion of the drain (322) extends along a second portion of the side of the dielectric layer (312).

Example 15 includes the transistor structure of example 14, or of any other example or embodiment herein, wherein the source (320) and the drain (322) are substantially perpendicular to a plane of the surface of the 2D layer (304), and wherein the source (320) and the drain (322) are substantially parallel to each other.

Example 16 includes the transistor structure of example 14, or of any other example or embodiment herein, wherein the source (320) and the drain (322) extend into the 2D layer (304).

Example 17 includes the transistor structure of example 14, or of any other example or embodiment herein, wherein the cap layer (310) includes Al, La, Hf, Ti, Zr, O, $Al_2O_3$, $La_2O_3$, $HfO_2$, $ZrO_2$, and/or $TiO_2$.

Example 18 includes the transistor structure of example 14, or of any other example or embodiment herein, wherein the oxide layer (353) is a first oxide layer; and further comprising a second oxide layer (306), and wherein the 2D layer (304) is on the second oxide layer (306).

Example 19 includes the transistor structure of example 18, or of any other example or embodiment herein, wherein the metal layer (355) is a first metal layer; and further comprising a second metal layer (308); and wherein the second oxide layer (306) is on the second metal layer (308).

Example 20 includes the transistor structure of example 19, or of any other example or embodiment herein, wherein the second metal layer (308) is a gate metal that includes a selected one or more of: copper, aluminum, cobalt, titanium, nitrogen, or tungsten.

Example 21 includes the transistor structure of example 19, or of any other example or embodiment herein, further comprising: a third oxide layer (330) that is substantially perpendicular to the surface of the 2D layer (304), wherein the third oxide layer (330) at least partially surrounds the source (320), the drain (322), the dielectric layer (312), the 2D layer (304), the first oxide layer (353), the second oxide layer (306), the first metal layer (355), and the second metal layer (308).

Example 22 includes the transistor structure of example 14, or of any other example or embodiment herein, further comprising a capacitor (372), wherein the capacitor (372) is electrically coupled with the drain (322).

Example 23 is a method for creating a back end of line memory cell, the method comprising: providing a gate stack, the gate stack including: an oxide layer; a 2D layer on the oxide layer; a cap layer on the 2D layer; and a dielectric layer on the cap layer; forming a first cavity in the oxide layer that extends to a surface of the cap layer by performing a dry etch; forming a second cavity in the cap layer that extends to a surface of the 2D layer by performing a wet etch, wherein the second cavity is underneath the first cavity; and filling the first cavity and the second cavity with a source or a drain material.

Example 24 includes the method of example 23, or of any other example or embodiment herein, wherein the oxide layer is a first oxide layer; and wherein immediately after providing the gate stack step, the method further comprises surrounding the gate stack with a second oxide layer.

Example 25 includes the method of example 23, or of any other example or embodiment herein, wherein forming the second cavity in the cap layer further includes forming the second cavity into the 2D layer.

Example 26 is a transistor structure comprising: a first metal layer (686); a ferroelectric layer (684) on the first metal layer (686); a second metal layer (682) on the ferroelectric layer (684); an oxide layer (606) on the second metal layer (682); a 2D layer (604) on the oxide layer (606); a cap layer (610) with a first side and a second side opposite the first side, wherein the first side of the cap layer (610) is on a surface of the 2D layer (604); a dielectric layer (612), wherein a side of the dielectric layer (612) is on the second side of the cap layer (610); a source (620) that extends through the dielectric layer (612) and through the cap layer (610) to the surface of the 2D layer (604); a drain (622) that extends through the dielectric layer (612) and through the cap layer (610) to the surface of the 2D layer (604); and wherein a portion of the source (620) extends along a first portion of the side of the dielectric layer (612), wherein a portion of the drain (622) extends along a second portion of the side of the dielectric layer (612), and wherein a portion of the cap layer (610) is between the portion of the source (620) and the portion of the drain (622).

Example 27 includes the transistor structure of example 26, or of any other example or embodiment herein, wherein the source (620) and the drain (622) are substantially perpendicular to a plane of the surface of the 2D layer (604).

Example 28 includes the transistor structure of example 26, or of any other example or embodiment herein, wherein the source (620) and the drain (622) are substantially parallel to each other.

Example 29 includes the transistor structure of example 26, or of any other example or embodiment herein, wherein the source (620) and the drain (622) extend into the 2D layer (604).

Example 30 includes the transistor structure of example 26, or of any other example or embodiment herein, wherein the cap layer (610) includes a selected one or more of: Al, La, Hf, Ti, Zr, O, $Al_2O_3$, $La_2O_3$, $HfO_2$, $ZrO_2$, and/or $TiO_2$.

Example 31 includes the transistor structure of example 26, or of any other example or embodiment herein, wherein the dielectric layer (612) includes a selected one or more of: silicon, oxygen, or nitrogen.

Example 32 includes the transistor structure of example 26, or of any other example or embodiment herein, wherein the first metal layer (686) or the second metal layer (682) is a gate metal that includes a selected one or more of: copper, aluminum, cobalt, titanium, nitrogen, or tungsten.

Example 33 includes the transistor structure of example 32, or of any other example or embodiment herein, wherein the oxide layer (606) is a first oxide layer; and further comprising: a second oxide layer (630) that is substantially perpendicular to the surface of the 2D layer (604), wherein the second oxide layer (630) at least partially surrounds the first metal layer (686), the ferroelectric layer (684), the second metal layer (682), the first oxide layer (606), the 2D layer (604), the cap layer (610), the dielectric layer (612), the source (620) and the drain (622).

Example 34 includes the transistor structure of example 26, or of any other example or embodiment herein, wherein the first metal layer (686) is on an electrically conductive via (632).

Example 35 includes the transistor structure of example 26, or of any other example or embodiment herein, wherein the transistor structure is a plurality of transistor structures, and wherein the plurality of transistor structures are physically coupled.

Example 36 includes the transistor structure of example 26, or of any other example or embodiment herein, wherein the ferroelectric layer (684) includes a selected one or more of: hafnium, oxygen, or zirconium.

Example 37 includes the transistor structure of example 26, or of any other example or embodiment herein, wherein the transistor structure is a memory cell.

Example 38 is a transistor structure comprising: a first metal layer (808) with a first oxide layer (806) on the first metal layer (808); a 2D layer (804) on the first oxide layer (806); a cap layer (810) with a first side and a second side opposite the first side, wherein the first side of the cap layer (810) is on a surface of the 2D layer (804); a dielectric layer (812), wherein a side of the dielectric layer (812) is on the second side of the cap layer (810); a source (820) and a drain (822) that extends through the dielectric layer (812) and through the cap layer (810) to the surface of the 2D layer (804); a second oxide layer (852) on the surface of the 2D layer (804), the second oxide layer (852) between the source (820) and the drain (822) and physically coupled with the source (820) and the drain (822); a second metal layer (886) on the second oxide layer (852), wherein the second oxide layer (852) electrically isolates the second metal layer (886) from the 2D layer (804), the source (820), and the drain (822); a ferroelectric layer (884) on the second metal layer (886); and a third metal layer (882) on the ferroelectric layer (884), wherein the ferroelectric layer (884) electrically isolates the second metal layer (886) from the third metal layer (882).

Example 39 includes the transistor structure of example 38, or of any other example or embodiment herein, wherein the source (820) and the drain (822) are substantially perpendicular to a plane of the surface of the 2D layer (804).

Example 40 includes the transistor structure of example 38, or of any other example or embodiment herein, wherein the source (820) and the drain (822) are substantially parallel to each other.

Example 41 includes the transistor structure of example 38, or of any other example or embodiment herein, wherein the cap layer (810) includes a selected one or more of: Al, La, Hf, Ti, Zr, O, $Al_2O_3$, $La_2O_3$, $HfO_2$, $ZrO_2$, and/or $TiO_2$.

Example 42 includes the transistor structure of example 38, or of any other example or embodiment herein, wherein the dielectric layer (812) includes a selected one or more of: silicon, oxygen, or nitrogen.

Example 43 includes the transistor structure of example 38, or of any other example or embodiment herein, wherein the first metal layer (808), second metal layer (886), or third metal layer (882) include a selected one or more of: copper, aluminum, cobalt, titanium, nitrogen, or tungsten.

Example 44 includes the transistor structure of example 38, or of any other example or embodiment herein, wherein the dielectric layer is a first dielectric layer; and further comprising: a second dielectric layer (830) that is substantially perpendicular to the surface of the 2D layer (804), wherein the second dielectric layer (830) at least partially surrounds the source (820), the drain (822), the first dielectric layer (812), the 2D layer (804), the first oxide layer (806), the second oxide layer (852), the first metal layer (808), the second metal layer (886), and the third metal layer (882).

Example 45 includes the transistor structure of example 38, or of any other example or embodiment herein, wherein the ferroelectric layer (884) includes a selected one or more of: hafnium, lanthanum, zirconium, and/or oxygen.

Example 46 includes the transistor structure of example 38, or of any other example or embodiment herein, wherein the first metal layer (808) is electrically coupled with an electrically conductive via (832).

Example 47 includes the transistor structure of example 38, or of any other example or embodiment herein, wherein the transistor structure forms a memory cell.

Example 48 is a method for creating a back end of line transistor structure, the method comprising: providing a gate stack, the gate stack including: a metal layer; a first oxide layer on the metal layer; a 2D layer on the oxide layer; a cap layer on a surface of the 2D layer; and a dielectric layer on the cap layer; forming a first cavity in the oxide layer that extends to a surface of the cap layer by performing a dry etch; forming a second cavity in the cap layer that extends to a surface of the 2D layer by performing a wet etch, wherein the second cavity is underneath the first cavity; and filling the first cavity and the second cavity with a source or a drain material.

Example 49 includes the method of example 48, or of any other example or embodiment herein, wherein the oxide layer is a first oxide layer and wherein the metal layer is a first metal layer; and further comprising: forming a third cavity between the source and the drain, wherein the third cavity extends to the surface of the 2D layer; forming a second oxide layer on at least a portion of the surface of the 2D layer, the source, and the drain; and forming a second metal layer on the second oxide layer, wherein the second oxide layer electrically isolates the second metal layer from the source, the drain, and the 2D layer.

Example 50 includes the method of example 49, or of any other example or embodiment herein, wherein the dielectric layer is a first dielectric layer; and further comprising: forming a second dielectric layer on the second metal layer; and forming a third metal layer on the second dielectric layer, wherein the second dielectric layer electrically isolates the third metal layer from the second metal layer.

What is claimed is:

1. A transistor structure comprising:
   a first metal layer;
   a ferroelectric layer on the first metal layer;

a second metal layer on the ferroelectric layer;

an oxide layer on the second metal layer;

a 2D layer on the oxide layer;

a cap layer with a first side and a second side opposite the first side, wherein the first side of the cap layer is on a surface of the 2D layer;

a dielectric layer, wherein a side of the dielectric layer is on the second side of the cap layer;

a source that extends through the dielectric layer and through the cap layer to the surface of the 2D layer;

a drain that extends through the dielectric layer and through the cap layer to the surface of the 2D layer; and wherein a portion of the source extends along a first portion of the side of the dielectric layer, wherein a portion of the drain extends along a second portion of the side of the dielectric layer, and wherein a portion of the cap layer is between the portion of the source and the portion of the drain.

2. The transistor structure of claim 1, wherein the source and the drain are substantially perpendicular to a plane of the surface of the 2D layer.

3. The transistor structure of claim 1, wherein the source and the drain are substantially parallel to each other.

4. The transistor structure of claim 1, wherein the source and the drain extend into the 2D layer.

5. The transistor structure of claim 1, wherein the cap layer includes a selected one or more of: Al, La, Hf, Ti, Zr, O, $Al_2O_3$, $La_2O_3$, $HfO_2$, $ZrO_2$, and/or $TiO_2$.

6. The transistor structure of claim 1, wherein the dielectric layer includes a selected one or more of: silicon, oxygen, or nitrogen.

7. The transistor structure of claim 1, wherein the first metal layer or the second metal layer is a gate metal that includes a selected one or more of: copper, aluminum, cobalt, titanium, nitrogen, or tungsten.

8. The transistor structure of claim 7, wherein the oxide layer is a first oxide layer; and further comprising:

a second oxide layer that is substantially perpendicular to the surface of the 2D layer, wherein the second oxide layer at least partially surrounds the first metal layer, the ferroelectric layer, the second metal layer, the first oxide layer, the 2D layer, the cap layer, the dielectric layer, the source and the drain.

9. The transistor structure of claim 1, wherein the first metal layer is on an electrically conductive via.

10. The transistor structure of claim 1, wherein the transistor structure is a plurality of transistor structures, and wherein the plurality of transistor structures are physically coupled.

11. The transistor structure of claim 1, wherein the ferroelectric layer includes a selected one or more of: hafnium, oxygen, or zirconium.

12. The transistor structure of claim 1, wherein the transistor structure is a memory cell.

13. A transistor structure comprising:

a first metal layer with a first oxide layer on the first metal layer;

a 2D layer on the first oxide layer;

a cap layer with a first side and a second side opposite the first side, wherein the first side of the cap layer is on a surface of the 2D layer;

a dielectric layer, wherein a side of the dielectric layer is on the second side of the cap layer;

a source and a drain that extends through the dielectric layer and through the cap layer to the surface of the 2D layer;

a second oxide layer on the surface of the 2D layer, the second oxide layer between the source and the drain and physically coupled with the source and the drain;

a second metal layer on the second oxide layer, wherein the second oxide layer electrically isolates the second metal layer from the 2D layer, the source, and the drain;

a ferroelectric layer on the second metal layer; and a third metal layer on the ferroelectric layer, wherein the ferroelectric layer electrically isolates the second metal layer from the third metal layer.

14. The transistor structure of claim 13, wherein the source and the drain are substantially perpendicular to a plane of the surface of the 2D layer.

15. The transistor structure of claim 13, wherein the source and the drain are substantially parallel to each other.

16. The transistor structure of claim 13, wherein the cap layer includes a selected one or more of: Al, La, Hf, Ti, Zr, O, $Al_2O_3$, $La_2O_3$, $HfO_2$, $ZrO_2$, and/or $TiO_2$.

17. The transistor structure of claim 13, wherein the dielectric layer includes a selected one or more of: silicon, oxygen, or nitrogen.

18. The transistor structure of claim 13, wherein the first metal layer, second metal layer, or third metal layer include a selected one or more of: copper, aluminum, cobalt, titanium, nitrogen, or tungsten.

19. The transistor structure of claim 13, wherein the dielectric layer is a first dielectric layer; and further comprising:

a second dielectric layer that is substantially perpendicular to the surface of the 2D layer, wherein the second dielectric layer at least partially surrounds the source, the drain, the first dielectric layer, the 2D layer, the first oxide layer, the second oxide layer, the first metal layer, the second metal layer, and the third metal layer.

20. The transistor structure of claim 13, wherein the ferroelectric layer includes a selected one or more of: hafnium, lanthanum, zirconium, and/or oxygen.

21. The transistor structure of claim 13, wherein the first metal layer is electrically coupled with an electrically conductive via.

22. The transistor structure of claim 13, wherein the transistor structure forms a memory cell.

* * * * *